United States Patent
Asai et al.

(10) Patent No.: US 12,142,476 B2
(45) Date of Patent: *Nov. 12, 2024

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Masayuki Asai, Toyama (JP); Tomoki Imamura, Toyama (JP); Kazuyuki Okuda, Toyama (JP); Yasuhiro Inokuchi, Toyama (JP); Norikazu Mizuno, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/323,160

(22) Filed: May 24, 2023

(65) Prior Publication Data

US 2023/0298883 A1 Sep. 21, 2023

Related U.S. Application Data

(63) Continuation of application No. 17/983,274, filed on Nov. 8, 2022, now Pat. No. 11,705,325, which is a (Continued)

(30) Foreign Application Priority Data

May 17, 2019 (JP) .................................. 2019-093761

(51) Int. Cl.
*H01L 21/02* (2006.01)
*C23C 16/458* (2006.01)
(Continued)

(52) U.S. Cl.
CPC ...... *H01L 21/0217* (2013.01); *C23C 16/4584* (2013.01); *C23C 16/50* (2013.01);
(Continued)

(58) Field of Classification Search
CPC ........... H01L 21/0217; H01L 21/02274; H01L 21/0228; H01L 21/67303; H01L 21/02211;
(Continued)

(56) References Cited

U.S. PATENT DOCUMENTS 11,705,325 B2 * 7/2023 Asai .................. H01L 21/02211
438/792
2013/0252437 A1 9/2013 Sano et al.
(Continued)

FOREIGN PATENT DOCUMENTS

JP 2013-225655 A 10/2013
JP 2014-007378 A 1/2014
(Continued)

OTHER PUBLICATIONS

Taiwanese Office Action, Taiwanese Patent Application No. 109111104, Jan. 7, 2021.
(Continued)

*Primary Examiner* — Kyoung Lee
(74) *Attorney, Agent, or Firm* — Volpe Koenig

(57) ABSTRACT

Provided is processing of a substrate including: forming film on substrate by performing cycle, multiple times, including non-simultaneously performing: (a) supplying precursor gas and inert gas to the substrate; and (b) supplying reaction gas to the substrate. In (a), at least one of the precursor and inert gas stored in first tank is supplied to the substrate, and at least one of the precursor and inert gas stored in second tank is supplied to the substrate. A concentration of the precursor gas in the first tank differs from that in the second tank.

(Continued)

Further, in (a), the at least one of the precursor and inert gas is supplied from the first tank to the substrate, and the at least one of the precursor and inert gas is supplied from the second tank to the substrate to suppress multiple adsorption of molecules constituting the precursor gas on the substrate's surface.

21 Claims, 8 Drawing Sheets

Related U.S. Application Data continuation of application No. 16/875,287, filed on May 15, 2020, now Pat. No. 11,527,401.

(51) Int. Cl.
  *C23C 16/50* (2006.01)
  *C23C 16/52* (2006.01)
  *H01L 21/673* (2006.01)

(52) U.S. Cl.
  CPC ........ *C23C 16/52* (2013.01); *H01L 21/02274* (2013.01); *H01L 21/0228* (2013.01); *H01L 21/67303* (2013.01)

(58) Field of Classification Search
  CPC ......... H01L 21/02225; H01L 21/02247; H01L 21/67011; H01L 21/02126; H01L 21/02164; H01L 21/02186; C23C 16/4584; C23C 16/50; C23C 16/52; C23C 16/345; C23C 16/448; C23C 16/45542; C23C 16/45561; C23C 16/4554
  See application file for complete search history.

(56) References Cited

U.S. PATENT DOCUMENTS

| | | |
|---|---|---|
| 2013/0323935 A1 | 12/2013 | Suzuki et al. |
| 2016/0024654 A1 | 1/2016 | Fukushima et al. |
| 2018/0051374 A1 | 2/2018 | Kato et al. |
| 2018/0265974 A1 | 9/2018 | Okura et al. |

FOREIGN PATENT DOCUMENTS

| | | |
|---|---|---|
| JP | 2016-034020 A | 3/2016 |
| JP | 2018-029120 A | 2/2018 |
| KR | 2013-0107249 A | 10/2013 |
| KR | 2018-0105587 A | 9/2018 |
| TW | 201901802 A | 1/2019 |

OTHER PUBLICATIONS

Korean Office Action, Korean Patent Application No. 10-2020-0058307, Jun. 24, 2021.
Japanese Office Action, Japanese Patent Application No. 2019-093761, Aug. 17, 2021.

\* cited by examiner

| Conditions of gas charging into tank | Uniformity of wafer in-plane film thickness | Uniformity of inter-wafer film thickness |
|---|---|---|
| Condition 1 | 2.05% | 0.90% |
| Condition 2 | 2.67% | 0.95% |
| Condition 3 | 3.81% | 1.14% |

FIG. 9

| Conditions of gas charging into tank | Effective flow rate of DCS gas | Flow rate of diluted $N_2$ gas necessary to comply with standard of explosion limit of DCS |
|---|---|---|
| Condition 1 | 4.8~6slm | 113~141slm |
| Condition 2 | 8~10slm | 188~234slm |

FIG. 10

| Conditions of $NH_3$ gas supply | WER ratio |
|---|---|
| Condition 4 | 0.95 |
| Condition 5 | 1 |

# METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from U.S. application Ser. No. 17/983,274, filed Nov. 8, 2022, which is a continuation of U.S. application Ser. No. 16/875,287, filed on May 15, 2022, which claims the benefit of priority from Japanese Patent Application No. 2019-093761, filed on May 17, 2019, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as one step in a process of manufacturing a semiconductor device, a step of forming a film such as a nitride film on a substrate by alternately supplying a precursor gas and a reaction gas to the substrate may be carried out.

SUMMARY

Some embodiments of the present disclosure provide a technique capable of improving uniformity of substrate in-plane film thickness of a film formed on a substrate.

According to an embodiment of the present disclosure, there is provided a technique that includes: forming a film on a substrate in a process chamber by performing a cycle a predetermined number of times, the cycle including non-simultaneously performing: (a) supplying a precursor gas and an inert gas to the substrate; and (b) supplying a reaction gas to the substrate, wherein in (a), at least one selected from the group of the precursor gas and the inert gas stored in a first tank is supplied to the substrate from a first supplier, and at least one selected from the group of the precursor gas and the inert gas stored in a second tank different from the first tank is supplied to the substrate from a second supplier different from the first supplier, and wherein a concentration of the precursor gas in the first tank in a state where at least one selected from the group of the precursor gas and the inert gas is stored in the first tank is set to be different from a concentration of the precursor gas in the second tank in a state where at least one selected from the group of the precursor gas and the inert gas is stored in the second tank.

BRIEF DESCRIPTION OF DRAWINGS

FIG. 9 is a table showing measurement results of an effective flow rate of a dichlorosilane gas and a flow rate of diluted $N_2$ gas necessary to comply with a standard of explosion limit of the dichlorosilane gas when a SiN film is formed on a wafer while changing conditions of gas charging into a tank.

FIG. 10 is a table showing measurement results of a wet etching rate of a SiN film when the SiN film is formed on a wafer while changing conditions of $NH_3$ gas supply.

DETAILED DESCRIPTION

Figure 1:
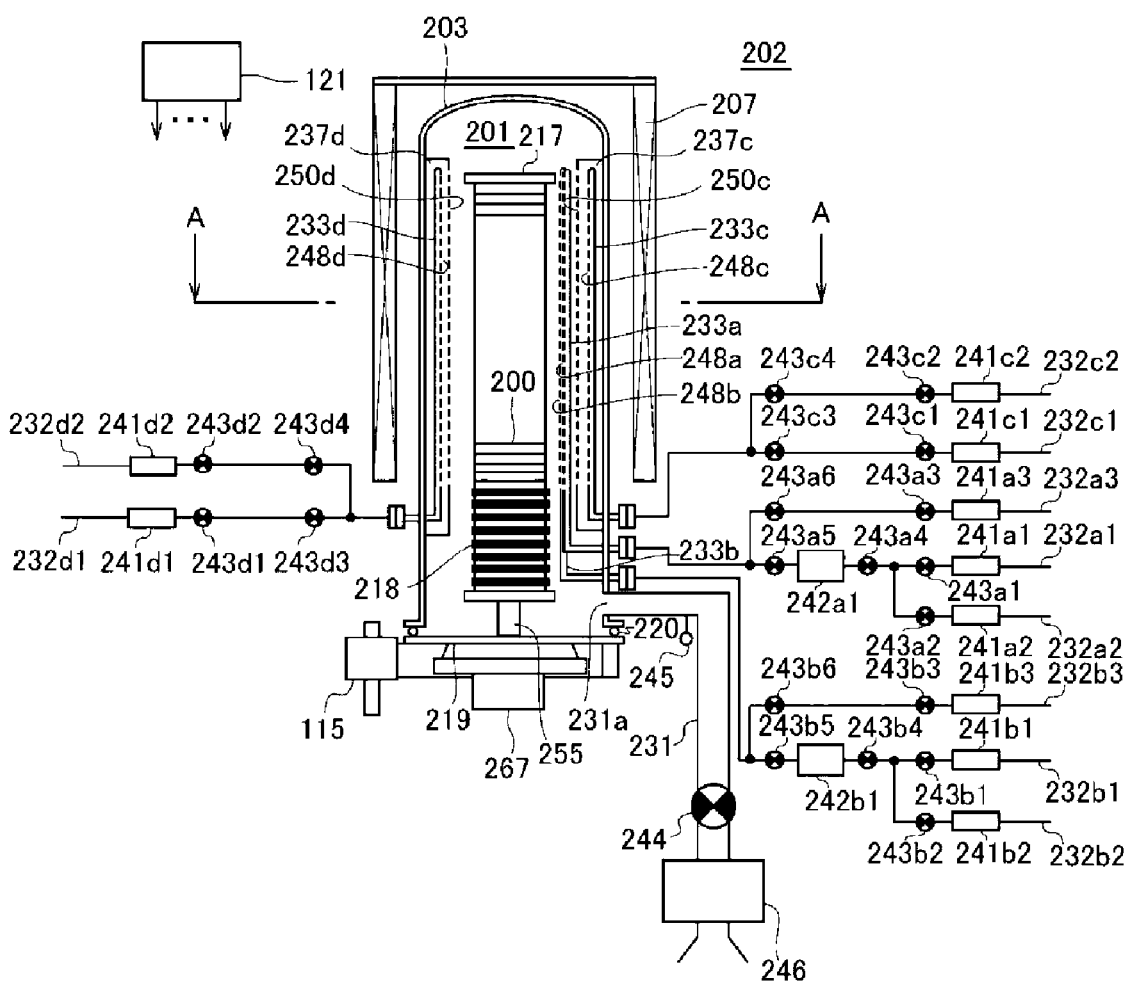
FIG. 1 is a schematic configuration view of a vertical process furnace of a substrate processing apparatus suitably used in an embodiment of the present disclosure, in which a portion of the process furnace is shown in a vertical sectional view.

<An Embodiment of the Present Disclosure>
(1) Configuration of Substrate Processing Apparatus As shown in FIG. 1, a process furnace 202 includes a heater 207 as a heating part (heating mechanism). The heater 207 has a cylindrical shape and is supported by a heater base (not shown) as a support plate so as to be vertically installed. The heater 207 also functions as an activation mechanism (an excitation part or an exciter) configured to activate (excite) a gas with heat. In the present disclosure, the term "gas" may refer to gas without liquid or gas that partially includes liquid in a mist state.

A reaction tube 203 that constitutes a reaction container (a processing container) is disposed inside the heater 207 to be concentric with the heater 207. The reaction tube 203 is made of a heat resistant material such as quartz ($SiO_2$) or silicon carbide (SiC) and is formed in a cylindrical shape with its upper end closed and its lower end opened. A process chamber 201 is formed in a cylindrical hollow portion of the reaction tube 203. The process chamber 201 is configured to be capable of accommodating wafers 200 as substrates. The wafers 200 processed in the process chamber 201.

In the process chamber 201, nozzles 233a, 233b, 233c and 233d as gas supply parts (or gas suppliers) are respectively installed so as to penetrate a lower side wall of the reaction tube 203. Each of the nozzles 233a, 233b, 233c and 233d is made of a heat resistant material such as quartz or SiC and is formed as an L-shaped long nozzle. Gas supply pipes 232a1, 232b1, 232c1 and 232d1 are connected to the nozzles 233a, 233b, 233c and 233d, respectively. In this manner, four nozzles 233a, 233b, 233c and 233d and four gas supply pipes 232a1, 232b1, 232c1 and 232d1 are respectively installed at the reaction tube 203, so that it is configured such that a plurality of types of gases, here, two types of gases, can be supplied into the process chamber 201. The nozzles 233a to 233d are also referred to as first to fourth nozzles, respectively. The gas supply pipes 232a1 to 232d1 are also referred to as first to fourth gas supply pipes (R1 to R4), respectively. The gas supply pipes 232a1 to 232d1 and a gas supply pipe to be described later are each made of a metal material such as stainless steel (SUS).

In addition, a metal manifold that supports the reaction tube 203 may be installed below the reaction tube 203, and each nozzle may be installed to penetrate the side wall of the manifold. Further, an exhaust pipe 231 to be described later may be installed at the manifold. In this case, the processing container (reaction container) is constituted by the reaction tube 203 and the manifold. In this manner, a furnace port of the process furnace 202 may be made of metal, and a nozzle or the like may be attached to the metal furnace port. The manifold may be made of, for example, a metal material such as SUS.

Mass flow controllers (MFCs) 241a1 and 241b1, which are flow rate controllers (flow control parts), valves 243a1 and 243b1, which are opening/closing valves, valves 243a4 and 243b, tanks 242a1 and 242b1, which are gas storage parts, and valves 243a5 and 243b5 are installed at the gas supply pipes 232a1 and 232b1, respectively in order from the upstream side of gas flow. Gas supply pipes 232a2 and 232b2 are connected to the gas supply pipes 232a1 and 232b1 at the downstream side of the valves 243a1 and 243b1 and at the upstream side of the valves 243a4 and 243b4, respectively. At the gas supply pipes 232a2 and 232b2, MFCs 241a2 and 241b2 and valves 243a2 and 243b2 are installed respectively, in order from the upstream side of gas flow. Gas supply pipes 232a3 and 232b3 are connected to the gas supply pipes 232a1 and 232b1 at the downstream side of the valves 243a5 and 243b5, respectively. MFCs 241a3 and 241b3, valves 243a3 and 243b3 and valves 243a6 and 243b6 are installed at the gas supply pipes 232a3 and 232b3 respectively, in order from the upstream side of gas flow. The tanks 242a1 and 242b1 are also referred to as a first tank and a second tank, respectively.

At the gas supply pipes 232c1 and 232d1, MFCs 241c1 and 241d1, valves 243c1 and 243d1 and valves 243c3 and 243d3 are installed respectively, in order from the upstream side of gas flow. Gas supply pipes 232c2 and 232d2 are connected to the gas supply pipes 232c1 and 232d1 at the downstream side of the valves 243c3 and 243d3, respectively. At the gas supply pipes 232c2 and 232d2, MFCs 241c2 and 241d2, valves 243c2 and 243d2 and valves 243c4 and 243d4 are installed respectively, in order from the upstream side of gas flow.

Figure 2:
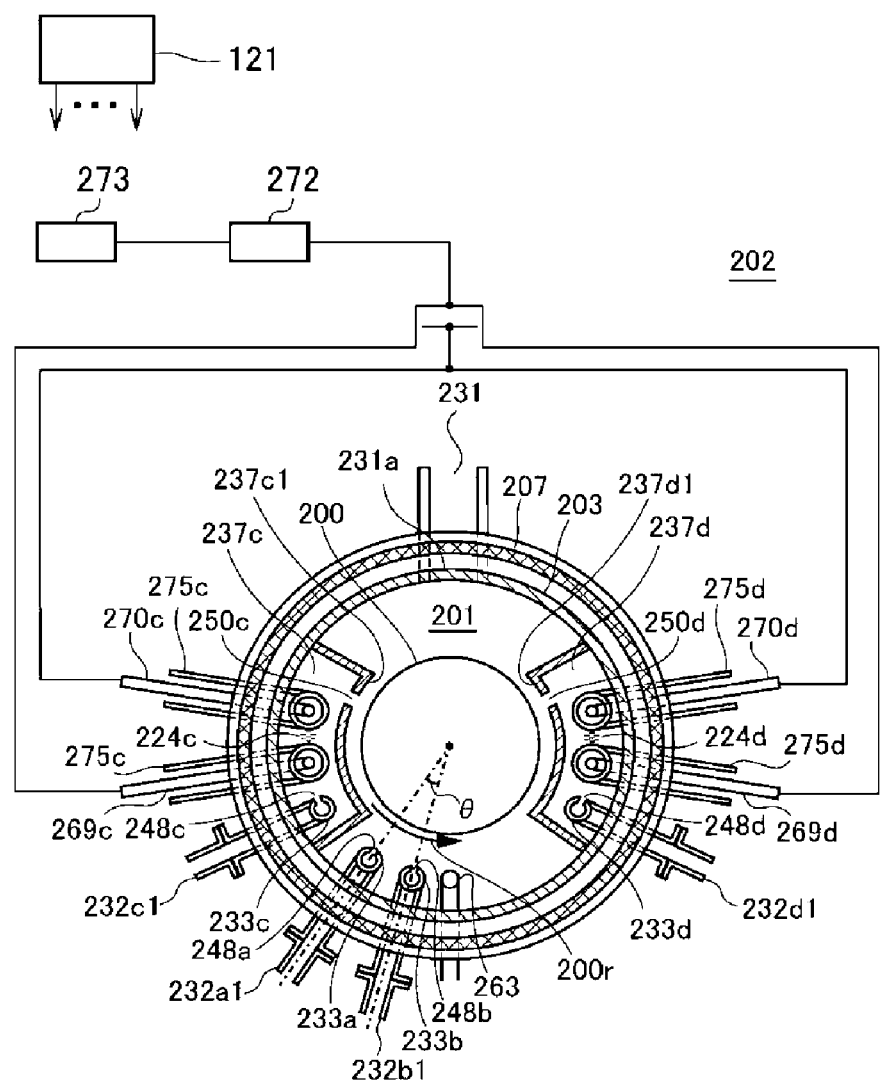
FIG. 2 is a schematic configuration view of a vertical process furnace of a substrate processing apparatus suitably used in an embodiment of the present disclosure, in which a portion of the process furnace is shown in a cross section taken along line A-A.

As shown in FIG. 2, the nozzles 233a, 233b, 233c and 233d connected to tips of gas supply pipes 232a1, 232b1, 232c1 and 232d1 are installed in an annular space (in a plane view) between an inner wall of the reaction tube 203 and the wafers 200 so as to extend upward along an arrangement direction of the wafers 200 from a lower portion of the inner wall of the reaction tube 203 to an upper portion thereof. That is, the nozzles 233a, 233b, 233c and 233d are installed in a region horizontally surrounding a wafer arrangement region (in which the wafers 200 are arranged) at a lateral side of the wafer arrangement region, along the wafer arrangement region. Gas supply holes 248a, 248b, 248c and 248d configured to supply gases are formed on side surfaces of the nozzles 233a, 233b, 233c and 233d, respectively. Each of the gas supply holes 248a and 248b is opened toward the center of the reaction tube 203 and is capable of supplying the gas toward the wafers 200. The gas supply holes 248c and 248d are respectively opened toward centers of buffer chambers 237c and 237d to be described later. A plurality of gas supply holes 248a, 248b, 248c and 248d may be formed from a lower portion of the reaction tube 203 to an upper portion thereof.

The nozzles 233a and 233b are arranged adjacent to each other as shown in FIG. 2. Specifically, the nozzles 233a and 233b are arranged at positions where a central angle θ formed between a straight line (first straight line) connecting a center of the wafer 200 and a center of the nozzle 233a and a straight line (second straight line) connecting the center of the wafer 200 and a center of the nozzle 233b (a central angle θ with respect to an arc with the centers of the nozzles 233a and 233b as both ends) is an acute angle, for example, an angle in a range of 10 to 30 degrees, specifically 10 to 20 degrees in some embodiments, when seen in the plane view.

The nozzles 233c and 233d are installed in the buffer chambers 237c and 237d, respectively, which are gas dispersion spaces. The buffer chambers 237c and 237d are formed between the inner wall of the reaction tube 203 and a partition 237c1 and between the inner wall of the reaction tube 203 and a partition 237d1, respectively. The buffer chambers 237c and 237d (the partitions 237c1 and 237d1) are respectively disposed in an annular space (in the plane view) between the inner wall of the reaction tube 203 and the wafers 200 and at a portion extending from a lower portion of the inner wall of the reaction tube 203 to an upper portion thereof along the arrangement direction of the wafers 200. That is, the buffer chambers 237c and 237d (the partitions 237c1 and 237d1) are respectively installed in the region horizontally surrounding the wafer arrangement region at the lateral side of the wafer arrangement region, along the wafer arrangement region. Gas supply holes 250c and 250d configured to supply gases are formed at ends of the surfaces of the partition 237c1 and 237d1 facing (adjacent to) the wafers 200, respectively. The gas supply holes 250c and 250d are opened toward the center of the reaction tube 203 and is capable of supplying the gases toward the wafers 200. A plurality of gas supply holes 250c and 250d are formed from the lower portion of the reaction tube 203 to the upper portion thereof.

As shown in FIG. 2, the buffer chambers 237c and 237d are arranged in a line-symmetrical relationship, with having a straight line connecting the center of the wafer 200 and a center of an exhaust port 231a (to be described later) installed at the side wall of the reaction tube 203 as a symmetrical axis when seen in the plane view. That is, the buffer chambers 237c and 237d are arranged such that straight lines respectively connecting the centers of the gas supply hole 250c of the buffer chamber 237c, the gas supply hole 250d of the buffer chamber 237d, and the exhaust port 231a form an isosceles triangle. As a result, gas flows flowing from the buffer chambers 237c and 237d to the wafers 200 become uniform. That is, the gas flows flowing from the two buffer chambers 237c and 237d to the wafers 200 are line-symmetrical to each other, with having a straight line connecting the center of the wafer 200 and the center of the exhaust port 231a as a symmetrical axis. The buffer chambers 237c and 237d are also referred to as a first buffer chamber and a second buffer chamber, respectively.

A halosilane-based gas containing silicon (Si) as a main element (a predetermined element) constituting a film to be formed and a halogen element as precursor gases which are film-forming gases (processing gases) can be supplied from the gas supply pipes 232a1 and 232b1 into the process chamber 201 via the MFCs 241a1 and 241b1, the valves 243a1 and 243b1, the valves 243a4 and 243b4, the tanks 242a1 and 242b1, the valves 243a5 and 243b5 and the nozzles 233a and 233b, respectively. The precursor gas refers to a gaseous precursor, for example, a gas obtained by vaporizing a precursor in a liquid state at normal temperature and normal pressure, a precursor in a gaseous state at normal temperature and normal pressure, and the like. The halogen element includes chlorine (Cl), fluorine (F), bromine (Br), iodine (I) and the like. The halosilane-based gas acts as a Si source. As the halosilane-based gas, for example, a chlorosilane-based gas containing Cl can be used. As the chlorosilane-based gas, for example, a dichlorosilane ($SiH_2Cl_2$, abbreviation: DCS) gas can be used.

A nitrogen ($N_2$) gas as an inert gas can be supplied from the gas supply pipes 232a2 and 232b2 into the process chamber 201 via the MFCs 241a2 and 241b2, the valves 243a2 and 243b2, the gas supply pipes 232a1 and 232b1, the valves 243a4 and 243b4, the tanks 242a1 and 242b1, the valves 243a5 and 243b5 and the nozzles 233a and 233b, respectively. The $N_2$ gas acts as a purge gas, a dilution gas, a carrier gas or a multiple adsorption suppress gas of a DCS gas.

An $N_2$ gas as an inert gas can be supplied from the gas supply pipes 232a3 and 232b3 into the process chamber 201 via the MFCs 241a3 and 241b3, the valves 243a3 and 243b3, the valves 243a6 and 243b6, the gas supply pipes 232a1 and 232b1 and the nozzles 233a and 233b, respectively. The $N_2$ gas acts as a purge gas, a dilution gas or a carrier gas.

A nitrogen (N)-containing gas as a reaction gas, which is a film-forming gas (a processing gas), can be supplied from the gas supply pipes 232c1 and 232d1 into the process chamber 201 via the MFCs 241c1 and 241d1, the valves 243c1 and 243d1, the valves 243c3 and 243d3, the nozzles 233c and 233d and the buffer chambers 237c and 237d, respectively. As the N-containing gas, for example, a hydrogen-nitride-based gas can be used. The hydrogen-nitride-based gas can be said to be a substance composed of only two elements, N and hydrogen (H), and acts as a nitriding gas, that is, an N source. As the hydrogen-nitride-based gas, for example, an ammonia ($NH_3$) gas can be used.

An $N_2$ gas as an inert gas can be supplied from the gas supply pipes 232c2 and 232d2 into the process chamber 201 via the MFCs 241c2 and 241d2, the valves 243c2 and 243d2, the valves 243c4 and 243d4, the gas supply pipes 232c1 and 232d1 and the nozzles 233c and 233d, respectively. The $N_2$ gas acts as a purge gas, a dilution gas or a carrier gas.

A first supply system (precursor gas/inert gas supply system) configured to supply at least one selected from the group of the DCS gas and the $N_2$ gas stored in the tank 242a1 from the nozzle 233a to the wafers 200 in the process chamber 201 mainly includes the gas supply pipes 232a1 to 232a3, the MFCs 241a1 to 241a3, the valves 243a1 to 243a6, the tank 242a1 and the nozzle 233a.

A second supply system (precursor gas/inert gas supply system) configured to supply at least one selected from the group of the DCS gas and the $N_2$ gas stored in the tank 242b1 from the nozzle 233b to the wafers 200 in the process chamber 201 mainly includes the gas supply pipes 232b1 to 232b3, the MFCs 241b1 to 241b3, the valves 243b1 to 243b6, the tank 242b1 and the nozzle 233b.

A third supply system (reaction gas/inert gas supply system) configured to supply at least one selected from the group of the $NH_3$ gas and the $N_2$ gas from the nozzle 233c and the buffer chamber 237c to the wafers 200 in the process chamber 201 mainly includes the gas supply pipes 232c1 and 232c2, the MFCs 241c1 and 241c2, the valves 243c1 to 243c4, the nozzle 233c and the buffer chamber 237c.

A fourth supply system (reaction gas/inert gas supply system) configured to supply at least one selected from the group of the $NH_3$ gas and the $N_2$ gas from the nozzle 233d and the buffer chamber 237d to the wafers 200 in the process chamber 201 mainly includes the gas supply pipes 232d1 and 232d2, the MFCs 241d1 and 241d2, the valves 243d1 to 243d4, the nozzle 233d and the buffer chamber 237d. In the present disclosure, the fourth supply system may be included in the third supply system.

As shown in FIG. 2, two rod-shaped electrodes 269c and 270c made of a conductor and having an elongated structure are respectively installed in the buffer chamber 237c along the upper portion of the inner wall of the reaction tube 203 from the lower portion thereof so as to extend upward in the arrangement direction of the wafers 200. Each of the rod-shaped electrodes 269c and 270c is installed in parallel with the nozzle 233c. Each of the rod-shaped electrodes 269c and 270c is protected by being covered by an electrode protection tube 275c from below to above. One of the rod-shaped electrodes 269c and 270c is connected to a high frequency power supply 273 via a matching device 272, and the other is connected to a ground which is a reference potential. Here, the rod-shaped electrode 269c is connected to the high frequency power supply 273 via the matching device 272, and the rod-shaped electrode 270c is connected to the ground which is the reference potential. By applying high frequency (RF) power between the rod-shaped electrodes 269c and 270c from the high frequency power supply 273 via the matching device 272, plasma is generated in a plasma generation region 224c between the rod-shaped electrodes 269c and 270c.

Similarly, as shown in FIG. 2, two rod-shaped electrodes 269d and 270d made of a conductor and having an elongated structure are installed in the buffer chamber 237d along the upper portion of the inner wall of the reaction tube 203 from the lower portion thereof so as to extend upward in the arrangement direction of the wafers 200. Each of the rod-shaped electrodes 269d and 270d is installed in parallel with the nozzle 233d. Each of the rod-shaped electrodes 269d and 270d is protected by being covered by an electrode protection tube 275d from above to below. One of the rod-shaped electrodes 269d and 270d is connected to the high frequency power supply 273 via the matching device 272, and the other is connected to the ground which is the reference potential. Here, the rod-shaped electrode 269d is connected to the high frequency power supply 273 via the matching device 272, and the rod-shaped electrode 270d is connected to the ground which is the reference potential. By applying an RF power between the rod-shaped electrodes 269d and 270d from the high frequency power supply 273 via the matching device 272, plasma is generated in a plasma generation region 224d between the rod-shaped electrodes 269d and 270d.

A plasma excitation part (activation mechanism) that excites (activates) a gas into a plasma state mainly includes the rod-shaped electrodes 269c and 270c, the electrode protection tube 275c, the rod-shaped electrodes 269d and 270d and the electrode protection tube 275d. The matching device 272 and the high frequency power supply 273 may be included in the plasma excitation part. Further, the buffer chambers 237c and 237d may be included in the excitation part. The plasma excitation part including the rod-shaped electrodes 269c and 270c is also referred to as a first plasma excitation part. The plasma excitation part including the rod-shaped electrodes 269d and 270d is also referred to as a second plasma excitation part.

The exhaust port 231a is installed below the side wall of the reaction tube 203. The exhaust pipe 231 configured to exhaust an internal atmosphere of the process chamber 201 is connected to the exhaust port 231a. A vacuum pump 246 as a vacuum exhaust device is connected to the exhaust pipe 231 via a pressure sensor 245 serving as a pressure detector (pressure detecting part) configured to detect the internal pressure of the process chamber 201 and an APC (Auto Pressure Controller) valve 244 serving as a pressure regulator (pressure regulating part). The APC valve 244 is configured to perform or stop a vacuum exhausting operation in the process chamber 201 by opening/closing the valve while the vacuum pump 246 is actuated, and is also configured to be capable of adjusting the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244 and the pressure sensor 245. The exhaust system may include the vacuum pump 246.

A seal cap 219, which serves as a furnace opening cover configured to be capable of hermetically sealing a lower end opening of the reaction tube 203, is installed under the reaction tube 203. The seal cap 219 is made of, for example, a metal material such as stainless steel (SUS) or the like, and is formed in a disc shape. An O-ring 220, which is a seal member making contact with the lower end of the reaction tube 203, is installed at an upper surface of the seal cap 219.

A rotation mechanism 267 configured to rotate a boat 217, which will be described later, is installed under the seal cap 219. A rotary shaft 255 of the rotation mechanism 267 is connected to the boat 217 through the seal cap 219. The rotation mechanism 267 is configured to rotate the wafers 200 by rotating the boat 217. As shown in FIG. 2, the rotation mechanism 267 rotates the wafers 200 in the direction of an arrow 200r (counterclockwise). That is, when a predetermined position of an edge portion of the wafer 200 passes through a triangular region connecting the nozzles 233a and 233b and the center of the wafers 200 in the plane view, the rotation mechanism 267 rotates the wafers 200 so that the predetermined position passes through a straight line (first straight line) connecting the nozzle 233a and the center of the wafers 200 and then passes through a straight line (second straight line) connecting the nozzle 233b and the center of the wafers 200.

The seal cap 219 is configured to be vertically moved up or down by a boat elevator 115 as an elevating mechanism installed vertically outside the reaction tube 203. The boat elevator 115 is configured as a transfer device (transfer mechanism) that loads/unloads (transfers) the wafers 200 supported by the boat 217 in/from the process chamber 201 by moving the seal cap 219 up or down. That is, the boat elevator 115 is configured as a transfer device (transfer mechanism) that transfers the boat 217, that is, the wafers 200, in/out of the process chamber 201.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC are held in multiple stages below the boat 217.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is in an L-shape, like the nozzle 233a, and is installed along the inner wall of the reaction tube 203.

Figure 3:
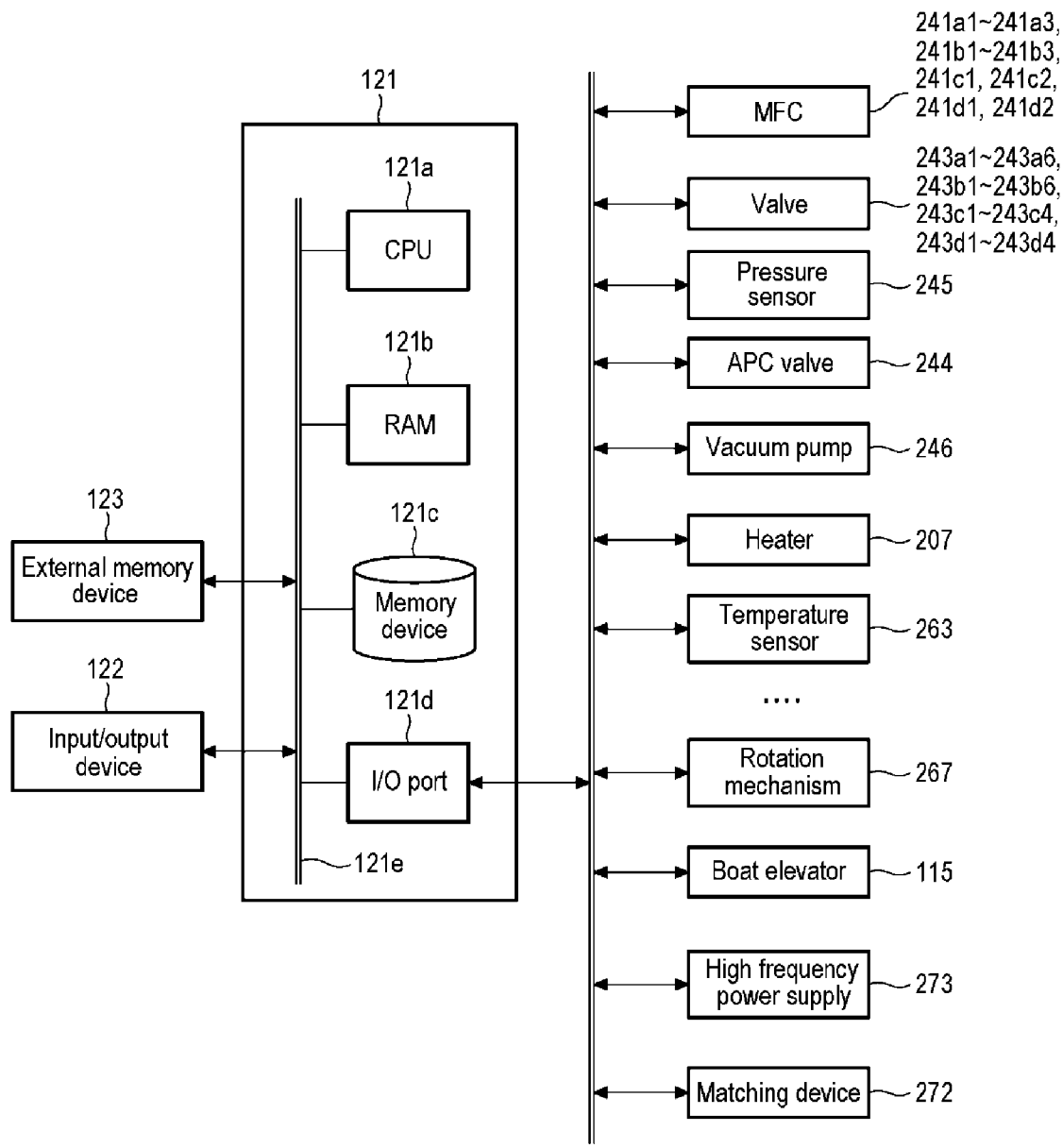
FIG. 3 is a schematic configuration view of a controller of a substrate processing apparatus suitably used in an embodiment of the present disclosure, in which a control system of the controller is shown in a block diagram.

As shown in FIG. 3, a controller 121, which is a control part (control means), may be configured as a computer including a central processing unit (CPU) 121a, a random access memory (RAM) 121b, a memory device 121c and an I/O port 121d. The RAM 121b, the memory device 121c and the I/O port 121d are configured to be capable of exchanging data with the CPU 121a via an internal bus 121e. An input/output device 122 includes, for example, a touch panel or the like, is connected to the controller 121.

The memory device 121c includes, for example, a flash memory, a hard disk drive (HDD) or the like. A control program for controlling operations of a substrate processing apparatus, a process recipe in which sequences, conditions, and the like of film formation to be described later are written, and the like are readably stored in the memory device 121c. The process recipe functions as a program for causing the controller 121 to execute each sequence in the film formation, which will be described later, to obtain a predetermined result. Hereinafter, the process recipe, the control program and the like may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a1 to 241a3, 241b1 to 241b3, 241c1, 241c2, 241d1 and 241d2, the valves 243a1 to 243a6, 243b1 to 243b6, 243c1 to 243c4 and 243d1 to 243d4, the pressure sensor 245, the APC valve 244, the vacuum pump 246, the heater 207, the temperature sensor 263, the rotation mechanism 267, the boat elevator 115, the high frequency power supply 273, the matching device 272 and so on.

The CPU 121a is configured to read and execute the control program from the memory device 121c. The CPU 121a is further configured to read the recipe from the memory device 121c according to an input of an operation command from the input/output device 122. In addition, the CPU 121a is configured to control the flow rate adjusting operation of various kinds of gases by the MFCs 241a1 to 241a3, 241b1 to 241b3, 241c1, 241c2, 241d1 and 241d2, the opening/closing operation of the valves 243a1 to 243a6, 243b1 to 243b6, 243c1 to 243c4 and 243d1 to 243d4, the opening/closing operation of the APC valve 244, the pressure adjusting operation performed by the APC valve 244 based on the pressure sensor 245, the actuating and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up or down by the boat elevator 115, the impedance adjusting operation by the matching device 272, the supply of power to the high frequency power supply 273 and so on, according to contents of the read recipe.

The controller 121 may be configured by installing, on the computer, the aforementioned program stored in an external memory device 123. The external memory device 123 includes, for example, a magnetic disk such as an HDD, an optical disc such as a CD, a magneto-optical disc such as an MO, or a semiconductor memory such as a USB memory. The memory device 121c or the external memory device 123 is configured as a computer-readable recording medium. Hereinafter, the memory device 121c and/or the external memory device 123 may be generally and simply referred to as a "recording medium." When the term "recording medium" is used herein, it may indicate a case of including the memory device 121c, a case of including the external memory device 123, or a case of including both the memory device 121c and the external memory device 123. Furthermore, the program may be provided to the computer using communication means such as the Internet or a dedicated line, instead of using the external memory device 123.

(2) Substrate Processing Process

As one of processes of manufacturing a semiconductor device using the above-described substrate processing apparatus, an example of a substrate processing sequence of forming a nitride film, which is an insulating film, as a thin film, on a wafer 200 as a substrate, that is, a film-forming sequence, will be described. In the following descriptions, the operations of the respective parts constituting the substrate processing apparatus are controlled by the controller 121.

Figure 4:
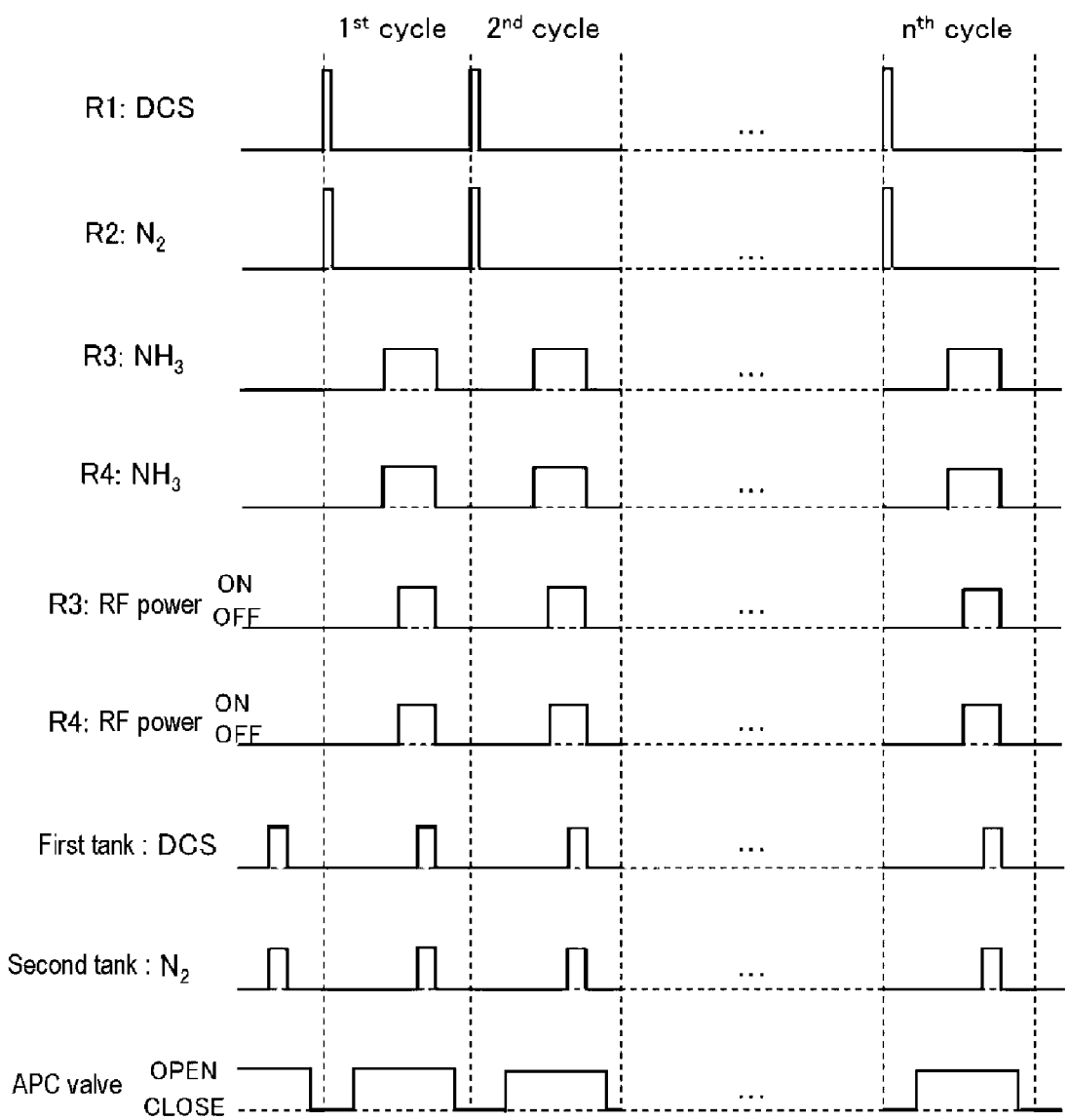
FIG. 4 is a diagram showing an example of supply timings of main gases and supply timings of RF power in a film-forming sequence according to an embodiment of the present disclosure.

The film-forming sequence shown in FIG. 4 includes forming a silicon nitride film (SiN film) as a film on a wafer 200 in a process chamber 201 by performing a cycle a predetermined number of times, the cycle including non-simultaneously performing: (a) supplying a DCS gas as a precursor gas and an $N_2$ gas as an inert gas to the wafer 200; and (b) supplying an $NH_3$ gas as a reaction gas to the wafer 200, wherein in (a), at least one selected from the group of the DCS gas and the $N_2$ gas stored in a first tank 242a1 is supplied to the wafer 200 from a first nozzle 233a as a first supply part (or a first supplier), and at least one selected from the group of the DCS gas and the $N_2$ gas stored in a second first tank 242b1 different from the first tank 242a1 is supplied to the wafer 200 from a second nozzle 233b as a second supply part (or a second supplier) different from the first supply part, and wherein a concentration of DCS gas in the first tank 242a1 in a state where at least one selected from the group of the DCS gas and the $N_2$ gas is stored in the first tank 242a1 is set to be different from a concentration of DCS gas in the second tank 242b1 in a state where at least one selected from the group of the DCS gas and the $N_2$ gas is stored in the second tank 242b1.

In addition, FIG. 4 shows an example where the concentration of DCS gas in the first tank 242a1 in a state where at least one selected from the group of the DCS gas and the $N_2$ gas is stored in the first tank 242a1 is set to be higher than the concentration of DCS gas in the second tank 242b1 in a state where at least one selected from the group of the DCS gas and the $N_2$ gas is stored in the second tank 242b1, that is, the concentration of $N_2$ gas in the second tank 242b1 in the state where at least one selected from the group of the DCS gas and the $N_2$ gas is stored in the second tank 242b1 is set to be higher than the concentration of $N_2$ gas in the first tank 242a1 in the state where at least one selected from the group of the DCS gas and the $N_2$ gas is stored in the first tank 242a1.

Specifically, FIG. 4 shows an example where the concentration of DCS gas in the first tank 242a1 in the state where at least one selected from the group of the DCS gas and the $N_2$ gas is stored in the first tank 242a1 is set to 100% (the concentration of $N_2$ gas is 0%), and the concentration of DCS gas in the second tank 242b1 in the state where at least one selected from the group of the DCS gas and the $N_2$ gas is stored in the second tank 242b1 is set to 0% (the concentration of $N_2$ gas is 100%).

Further, FIG. 4 shows an example where in (b), the $NH_3$ gas is plasma-excited and supplied to the wafer 200, that is, the $NH_3$ gas is plasma-excited and supplied as excited species such as $NH_3^*$, that is, active species. More specifically, FIG. 4 shows an example where in (b), $NH_3$ gases supplied to a plurality of plasma excitation parts (or plasma exciters) at the same flow rate are respectively plasma-excited and supplied to the wafer 200, that is, active species such as $NH_3^*$ generated by respectively plasma-exciting $NH_3$ gases supplied to the plurality of plasma excitation parts at the same flow rate are supplied to the wafer 200 from the plurality of plasma excitation parts. For the sake of convenience, some of the supply timings of the $N_2$ gas are not shown in FIG. 4. The same applies to FIGS. 5 and 6 to be described later.

In the present disclosure, the film-forming sequence shown in FIG. 4 may be expressed as follows for the sake of convenience. The same notation will be used in the description of other aspects and the like below.

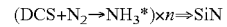

(DCS+$N_2 \rightarrow NH_3^*$)×$n \Rightarrow$ SiN

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer". When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

When a plurality of wafers 200 are charged into the boat 217 (wafer charging), as shown in FIG. 1, the boat 217 supporting the plurality of wafers 200 is lifted by the boat elevator 115 and is loaded into the process chamber 201 (boat loading). In this state, the seal cap 219 seals the lower end of the reaction tube 203 via the O-ring 220.

(Pressure Adjustment and Temperature Adjustment)

The interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information (pressure adjustment). Further, the wafers 200 in the process chamber 201 are heated by the heater 207 to a desired processing temperature. At this time, the supply of power to the heater 207 is feedback-controlled based on the temperature information detected by the temperature sensor 263 so that the interior of the process chamber 201 has a desired temperature distribution (temperature adjustment). Further, the rotation of the wafers 200 by the rotation mechanism 267 is started. The actuation of the vacuum pump 246, and the heating and rotation of the wafers 200 are continuously performed at least until the processing on the wafers 200 is completed.

(Pre-Purge 1)

Next, with the APC valve 244 fully opened, that is, with the interior of the process chamber 201 vacuum-exhausted, the valves 243a1, 243b1, 243c1, 243c3, 243d1 and 243d3 are closed, the valves 243a2 to 243a6, 243b2 to 243b6, 243c2, 243c4, 243d2 and 243d4 are opened, and a $N_2$ gas flows into the gas supply pipes 232a1, 232b1, 232c1 and 232d1. The flow rate of the $N_2$ gas is adjusted by the MFCs 241a2, 241a3, 241b2, 241b3, 241c2 and 241d2, and the $N_2$ gas is supplied into the process chamber 201 via the nozzles 233a, 233b, 233c and 233d and the buffer chambers 237c and 237d and is exhausted through the exhaust port 231a. At this time, the supply flow rate of the $N_2$ gas supplied from each gas supply pipe is set to a predetermined flow rate in a range of, for example, 100 to 10,000 sccm, and the internal pressure of the process chamber 201 is set to a predetermined pressure in a range of, for example, 20 to 30 Pa. Thus, the interior of each of the supply system, the process chamber 201 and the exhaust system can be purged so that an environment and a state before the supply of the DCS gas inside these can be adjusted and aligned.

(Pre-vacuum)

Thereafter, the valves 243a2, 243a3, 243a6, 243b2, 243b3, 243b6, 243c2, 243c4, 243d2 and 243d4 are closed while maintaining the state where the interior of the process chamber 201 is vacuum-exhausted, the valves 243a1, 243b1, 243c1, 243c3, 243d1 and 243d3 are closed, and the valves 243a4, 243a5, 243b4 and 243b5 are opened, whereby the supply of $N_2$ gas from each gas supply pipe is stopped, and the interior of each of the tanks 242a1 and 242b1 is vacuum-evacuated to a high vacuum state. At this time, the internal pressure of the process chamber 201 is set to a predetermined pressure within a range of, for example, 1 to 10 Pa. Thereafter, the valves 243a4, 243a5, 243b4 and 243b5 before and after (at the upstream side and the downstream side of) each of the tanks 242a1 and 242b1 are closed, and the interiors of the tanks 242a1 and 242b1 are respectively brought into a high-vacuum sealed state.

(Pre-Purge 2)

Thereafter, while maintaining the state where the interior of the process chamber 201 is vacuum-exhausted and the state where the interiors of the tanks 242a1 and 242b1 are in a high-vacuum sealed state, the valves 243a3, 243a6, 243b3, 243b6, 243c2, 243c4, 243d2 and 243d4 are opened, and the $N_2$ gas flows into the gas supply pipes 232a1, 232b1, 232c1 and 232d1. The flow rate of $N_2$ gas is adjusted by the MFCs 241a3, 241b3, 241c2 and 241d2, and the $N_2$ gas is supplied into the process chamber 201 via the nozzles 233a, 233b, 233c and 233d and the buffer chambers 237c and 237d and is exhausted through the exhaust port 231a. Processing conditions at this time are the same as those in the above-described pre-purge 1. Thus, the interior of each of the supply system, the process chamber 201 and the exhaust system can be further purged so that the environment and the state before the supply of the DCS gas inside these can be further adjusted and aligned.

(Gas Charging into Tank)

Thereafter, with the valve 243a5 closed, the valves 243a1 and 243a4 are opened, and a DCS gas is flown into the gas supply pipe 232a1. The flow rate of DCS gas is adjusted by the MFC 241a1, and the DCS gas is supplied into the tank 242a1 and is stored in the tank 242a1. After the DCS gas is stored in the tank 242a1 at a predetermined pressure and predetermined amount, the valves 243a1 and 243a4 are closed, and the DCS gas is sealed (confined) in the tank 242a1. A volume of the tank 242a1 may be, for example, 300 to 500 cc in some embodiments. In this case, the internal pressure of the tank 242a1 when the DCS gas is sealed in the tank 242a1 may be set to a high pressure of, for example, 20,000 Pa or more in some embodiments, and the amount of DCS gas stored in the tank 242a1 may be set to, for example, 120 to 360 cc, specially 120 to 240 cc in some embodiments. Through a series of these operations, the operation of charging the DCS gas into the tank 242a1 is completed (gas charging into the first tank).

In addition, with the valve 243b5 closed, the valves 243b2 and 243b4 are opened, and the $N_2$ gas is flown into the gas supply pipe 232b1. The flow rate of $N_2$ gas is adjusted by the MFC 241b2, and the $N_2$ gas is supplied into the tank 242b1 and is stored in the tank 242b1. After a predetermined pressure and predetermined amount of $N_2$ gas is stored in the tank 242b1, the valves 243b2 and 243b4 are closed, and the $N_2$ gas is sealed (confined) in the tank 242b1. A volume of the tank 242b1 may be, for example, 300 to 500 cc in some embodiments. In this case, the internal pressure of the tank 242b1 when the $N_2$ gas is sealed in the tank 242b1 may be set to a high pressure of, for example, 20,000 Pa or more, and the amount of $N_2$ gas stored in the tank 242b1 may be set to, for example, 120 to 400 cc, specially 120 to 300 cc in some embodiments. Through a series of these operations, the operation of charging the $N_2$ gas into the tank 242b1 is completed (gas charging into the second tank).

Figure 5:
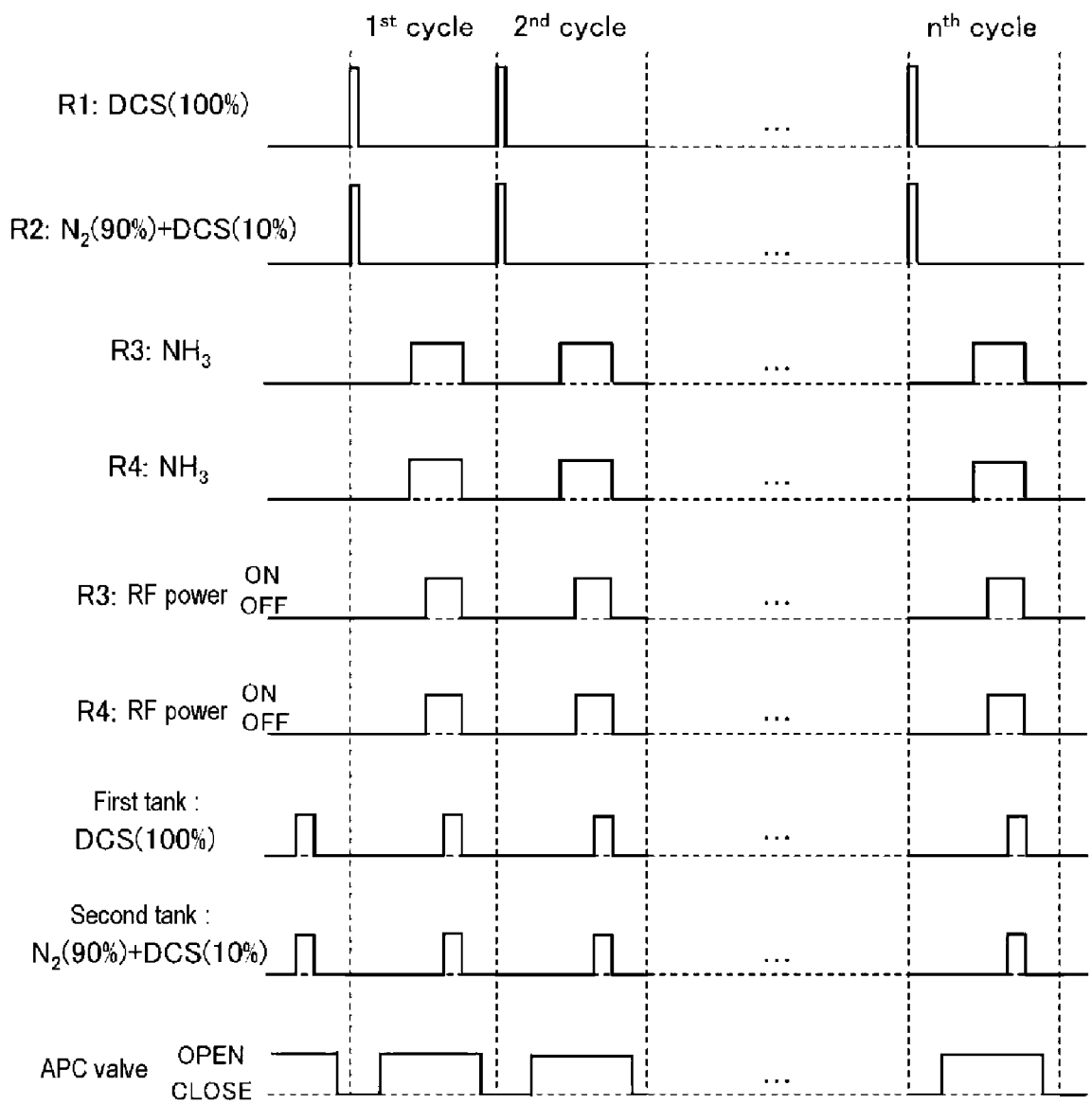
FIG. 5 is a diagram showing another example of supply timings of the main gases and supply timings of the RF power in the film-forming sequence according to the embodiment of the present disclosure.

At this time, the concentration of DCS gas stored in the tank 242a1 is set to be higher than the concentration of DCS gas stored in the tank 242b1. Further, the concentration of $N_2$ gas stored in the tank 242b1 is set to be higher than the concentration of $N_2$ gas stored in the tank 242a1. Further, the concentration of DCS gas stored in the tank 242a1 is set to be higher than the concentration of $N_2$ gas stored in the tank 242a1, and the concentration of $N_2$ gas stored in the tank 242b1 is set to be higher than the concentration of DCS gas stored in the tank 242b1. FIG. 4 shows an example where the concentration of DCS gas stored in the tank 242a1 is 100% (the concentration of $N_2$ gas is 0%), and the concentration of $N_2$ gas stored in the tank 242b1 is 100% (the concentration of DCS gas is 0%). For example, as shown in FIG. 5, the concentration of DCS gas stored in the tank 242a1 may be set to 100% (the concentration of $N_2$ gas is 0%), and the concentration of $N_2$ gas stored in the tank 242b1 may be set to 90% (the concentration of DCS gas is 10%).

At this time, the amount of DCS gas stored in the tank 242a1 is set to be larger than the amount of DCS gas stored in the tank 242b1. Further, the amount of $N_2$ gas stored in the tank 242b1 is set to be larger than the amount of $N_2$ gas stored in the tank 242a1. Further, the amount of DCS gas stored in the tank 242a1 is set to be larger than the amount of $N_2$ gas stored in the tank 242a1, and the amount of $N_2$ gas stored in the tank 242b1 is larger than the amount of DCS gas stored in the tank 242b1. FIG. 4 shows an example where the DCS gas is stored (present) alone in the tank 242a1 with the amount of $N_2$ gas stored in the tank 242a1 set to 0 cc, and the $N_2$ gas is stored (present) alone in the tank 242b1 with the amount of DCS gas stored in the tank 242b1 set to 0 cc.

($N_2$ Gas Charging into Process Chamber)

After the gas charging into the tank is completed, in the same manner as the above-described pre-purge 2, while the valves 243a3, 243a6, 243b3, 243b6, 243c2, 243c4, 243d2 and 243d4 are opened to maintain the state in which the $N_2$ gas is flown into the gas supply pipes 232a1, 232b1, 232c1 and 232d1, the APC valve 244 is fully closed to stop the exhaust of the interior of the process chamber 201. Thus, the interior of the process chamber 201 can be filled with the $N_2$ gas, and accordingly the internal pressure of the process chamber 201 can be increased. At this time, the supply flow rate of $N_2$ gas supplied from each gas supply pipe is set to a predetermined flow rate within a range of, for example, 100 to 10,000 sccm. Further, the internal pressure of the process chamber 201 is increased from a predetermined pressure in a range of, for example, 20 to 30 Pa to a predetermined pressure in a range of, for example, 200 to 400 Pa. Thus, when the DCS gas is supplied to the wafers 200 in the process chamber 201, diffusion of the DCS gas to the entire area in the process chamber 201 can be suppressed, and directionality (directivity) of DCS gas flow can be obtained. These operations make it possible to adjust the environment and state in the process chamber 201 before the supply of the DCS gas.

The above-described pre-purge 1, pre-vacuum, pre-purge 2, gas charging into the tank, and $N_2$ gas charging into the process chamber are preliminary preparations for performing a flash flow of DCS gas and $N_2$ gas to be described later.

(Film-Forming Step)

Thereafter, the following two steps, that is, steps A and B, are sequentially performed.

[Step A]

In this step, the DCS gas stored in the first tank 242a1 and the $N_2$ gas stored in the second tank 242b1 are simultaneously supplied to the wafers 200 in the process chamber 201 from the first nozzle 233a and the second nozzle 233b, respectively.

After the interior of the process chamber 201 is filled with the $N_2$ gas so that the internal pressure of the process chamber 201 reaches a predetermined pressure, the valves 243a5 and 243b5 are opened while maintaining the state where the APC valve 244 is fully closed and the state where the valves 243a4 and 243b4 are closed. Thus, the high pressure DCS gas stored in the tank 242a1 is supplied at once (pulse-wise) into the process chamber 201 via the gas supply pipe 232a1 and the nozzle 233a, and at the same time, the high pressure Na gas stored in the tank 242b1 is supplied at once (pulse-wise) into the process chamber 201 via the gas supply pipe 232b1 and the nozzle 233b. Hereinafter, this supply method is referred to as a flash flow. At this time, since the APC valve 244 is closed, the internal pressure of the process chamber 201 rises rapidly to a predetermined pressure. Thereafter, the state in which the internal pressure of the process chamber 201 has risen is maintained for a predetermined time, and the wafer 200 is exposed to a high pressure DCS gas and $N_2$ gas atmosphere.

Processing conditions in this step are exemplified as follows:

Processing temperature: 250 to 650 degrees C., specifically 300 to 600 degrees C.
Processing pressure (before flash flow): 200 to 400 Pa
Processing pressure (after flash flow): 900 to 1,500 Pa
DCS gas supply amount (R1): 120 to 360 cc, specifically 120 to 240 cc
Na gas supply amount (R2): 120 to 400 cc, specifically 120 to 300 cc
Na gas supply flow rate (R3): 100 to 10,000 sccm
Na gas supply flow rate (R4): 100 to 10,000 sccm
DCS gas and Na gas exposure time: 1 to 20 seconds, specifically 5 to 10 seconds In the present disclosure, notation of a numerical range such as "250 to 650 degrees C." means that a lower limit value and an upper limit value are included in the range. For example, "250 to 650 degrees C." means "equal to or higher than 250 degrees C. and equal to or lower than 650 degrees C." The same applies to other numerical ranges.

By exposing the wafer 200 to the DCS gas and $N_2$ gas atmosphere under the above-described conditions, a Si-containing layer containing Cl is formed as a first layer on the outermost surface of the wafer 200. The Si-containing layer containing Cl is formed on the outermost surface of the wafer 200 by chemisorption or physisorption of DCS, chemisorption of a substance (hereinafter, $SiH_xCl_y$) obtained by partially decomposing DCS, deposition of Si by thermal decomposition of DCS, and the like. The Si-containing layer containing Cl may be an adsorption layer (physisorption layer or chemisorption layer) of DCS or $SiH_xCl_y$, or may be a Si deposition layer containing Cl. In the present disclosure, the Si-containing layer containing Cl is also simply referred to as a Si-containing layer.

The concentration of DCS gas in the gas supplied by the flash flow through the nozzle 233a is higher than the concentration of DCS gas in the gas supplied by the flash flow through the nozzle 233b. Further, the concentration of $N_2$ gas in the gas supplied by the flash flow through the nozzle 233b is higher than the concentration of $N_2$ gas in the gas supplied by the flash flow through the nozzle 233a. Further, the concentration of DCS gas in the gas supplied by the flash flow through the nozzle 233a is higher than the concentration of $N_2$ gas in the gas supplied by the flash flow through the nozzle 233a, and the concentration of $N_2$ gas in the gas supplied by the flash flow through the nozzle 233b is higher than the concentration of DCS gas in the gas supplied by the flash flow through the nozzle 233b. FIG. 4 shows an example where the concentration of DCS gas in the gas supplied by the flash flow through the nozzle 233a is set to 100% (the concentration of $N_2$ gas is 0%), and the concentration of $N_2$ gas in the gas supplied by the flash flow through the nozzle 233b is set to 100% (the concentration of DCS gas is 0%). As shown in FIG. 5, the concentration of DCS gas in the gas supplied by the flash flow through the nozzle 233a may be set to 100% (the concentration of $N_2$ gas is 0%), and the concentration of $N_2$ gas in the gas supplied by the flash flow through the nozzle 233b may be set to 90% (the concentration of DCS gas is 10%).

At this time, the amount of DCS gas in the gas supplied by the flash flow through the nozzle 233a is larger than the amount of DCS gas in the gas supplied by the flash flow through the nozzle 233b. Further, the amount of $N_2$ gas in the gas supplied by the flash flow through the nozzle 233b is larger than the amount of $N_2$ gas in the gas supplied by the flash flow through the nozzle 233a. Further, the amount of DCS gas in the gas supplied by the flash flow through the nozzle 233a is larger than the amount of $N_2$ gas in the gas supplied by the flash flow through the nozzle 233a, and the amount of $N_2$ gas in the gas supplied by the flash flow through the nozzle 233b is larger than the amount of DCS gas in the gas supplied by the flash flow through the nozzle 233b. FIG. 4 shows an example where the amount of $N_2$ gas supplied by the flash flow through the nozzle 233a is 0 cc and the DCS gas is supplied alone by the flash flow through the nozzle 233a, and the amount of DCS gas supplied by the flash flow through the nozzle 233b is 0 cc and the $N_2$ gas is supplied alone by the flash flow through the nozzle 233b.

In this manner, the concentrations of the DCS gas and the $N_2$ gas in the gas supplied by the flash flow through the nozzle 233a are different from the concentrations of the DCS gas and the $N_2$ gas in the gas supplied by the flash flow through the nozzle 233b, and the amounts of the DCS gas and the $N_2$ gas in the gas supplied by the flash flow through the nozzle 233a are different from the amounts of the DCS gas and the $N_2$ gas in the gas supplied by the flash flow through the nozzle 233b, whereby it is possible to suppress multiple adsorption of DCS molecules constituting the DCS gas on the outermost surface of the wafer 200. As a result, uniformity of the wafer in-plane film thickness of the SiN film formed on the wafer 200 can be improved. Further, it is possible to improve a film quality itself in addition to improving uniformity of a wafer in-plane film quality.

Multiple adsorption means that some DCS molecules are superimposed and adsorbed on the outermost surface of the wafer 200. In the present disclosure, when a thickness of a second layer (to be described later) formed per cycle is 1.4 to 2 Å or more, it is considered that multiple adsorption occurs, and when the thickness is 1.4 to 2 Å or less, it is considered that non-multiple adsorption occurs. For example, when the thickness of the second layer (to be described later) formed per cycle is 2.1 to 5 Å, it is considered that the multiple adsorption occurs, and when the thickness is 0.1 to 1.3 Å, it is considered that the non-multiple adsorption occurs. When the thickness of the second layer (to be described later) formed per cycle is 1.4 to 2 Å, it can be considered that the multiple adsorption occurs, it can be considered that the non-multiple adsorption occurs, or it can be considered that both adsorption states occur depending on the conditions. When the thickness of the second layer (to be described later) formed per cycle is less than 1.4 Å, it can be considered that the non-multiple adsorption occurs surely.

After the first layer is formed on the wafer 200, the APC valve 244, which has been fully closed, is fully opened to vacuum-exhaust the interior of the process chamber 201 to remove the gas remaining in the process chamber 201 from the process chamber 201 (purge 1). Processing procedure and processing conditions at this time can be the same as those in the above-described pre-purge 1. In purge 1, pre-purge 1, pre-vacuum and pre-purge 2 are performed for flash flow of the DCS gas and the $N_2$ gas in the next cycle.

As the precursor gas, in addition to the DCS gas, it may be possible to use a chlorosilane-based gas such as a monochlorosilane ($SiH_3Cl$, abbreviation: MCS) gas, a trichlorosilane ($SiH_2Cl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like, a bromosilane-based gas such as a tetrabromosilane ($SiBr_4$) gas or the like, an iodosilane-based gas such as a tetraiodosilane ($SiI_4$) gas, and an aminosilane-based gas such as a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdiethylaminosilane ($Si[N(C_2H_5)_2]_2H_2$, abbreviation: BDEAS) gas, a bistertiarybutylaminosilane ($SiH_2[NH(C_4H_9)]_2$, abbreviation: BTBAS) gas, an diisopropylaminosilane ($SiH_3[N(C_3H_7)_2]$, abbreviation: DIPAS) gas or the like. As the inert gas, in addition to the $N_2$ gas, it may be possible to use, for example, various rare gases such as an Ar gas, a He gas, a Ne gas, a Xe gas and the like. The same applies to step B to be described later.

[Step B]

In this step, an $NH_3$ gas is supplied to the wafer 200 in the process chamber 201, that is, the first layer (Si-containing layer) formed on the surface of the wafer 200. When supplying the $NH_3$ gas, the $NH_3$ gas is supplied to two plasma excitation parts at the same flow rate and is simultaneously plasma-excited in the two plasma excitation parts to generate active species such as $NH_3^*$. The active species are simultaneously supplied from the two plasma excitation parts to the wafer 200 in the process chamber 201.

Specifically, with the APC valve 244 opened, that is, with the interior of the process chamber 201 exhausted, the valves 243c1 and 243d1 and the valves 243c3 and 243d3 are opened, and the $NH_3$ gas is flown into the gas supply pipes 232c1 and 232d1. The flow rate of $NH_3$ gas is adjusted by the MFCs 241c1 and 241d1, and the $NH_3$; gas is supplied into the process chamber 201 via the nozzles 233c and 233d and the buffer chambers 237c and 237d and is exhausted through the exhaust port 231a ($NH_3$ gas pre-flow).

After performing the $NH_3$ gas pre-flow for a predetermined time, in a state where the supply of $NH_3$ gas into the process chamber 201 via the nozzles 233c and 233d and the buffer chambers 237c and 237d from the gas supply pipes 232c1 and 232d1 and the exhaust of $NH_3$ gas from the exhaust port 231a are maintained, RF power is applied between the rod-shaped electrodes 269c and 270c and between the rod-shaped electrodes 269d and 270d. Thus, the $NH_3$ gas is plasma-excited in the buffer chambers 237c and 237d to generate the active species such as $NH_3^*$, and the generated active species are simultaneously supplied to the wafer 200 from each of the buffer chambers 237c and 237d ($NH_3^*$ flow).

Processing conditions in this step are exemplified as follows:

Processing temperature: 250 to 650 degrees C., specifically 300 to 600 degrees C.
Processing pressure: 1 to 100 Pa, specifically 1 to 50 Pa
$N_2$ gas supply flow rate (R1): 100 to 10,000 sccm
$N_2$ gas supply flow rate (R2): 100 to 10,000 sccm
$NH_3$ gas supply flow rate (R3): 10 to 10,000 sccm
$NH_3$ gas supply flow rate (R4): 10 to 10,000 sccm
$NH_3$ gas pre-flow time: 1 to 10 seconds, specifically 1 to 5 seconds
$NH_3^*$ flow time: 1 to 60 seconds, specifically 5 to 30 seconds
High frequency power: 50 to 1,000 W By supplying the $NH_3$ gas or the $NH_3^*$ to the wafer 200 under the above-described conditions, at least a portion of the first layer formed on the surface of the wafer 200 in step A is nitrided (modified). By nitriding the first layer, a layer containing Si and N, that is, a silicon nitride layer (SiN layer), is formed as the second layer on the surface of the wafer 200. The surface of the second layer is terminated with NH by being nitrided by the $NH_3$ gas or the $NH_3^*$. When the second layer is formed, impurities such as Cl contained in the first layer forms a gaseous substance containing at least Cl in a process of nitridation reaction (modifying reaction) of the first layer by the $NH_3$ gas or the $NH_3^*$ and is discharged from the process chamber 201. Thus, the second layer becomes a layer having the impurities such as Cl fewer than those of the first layer formed in step A.

After the second layer is formed on the wafer 200, the valves 243c1 and 243d1 and the valves 243c3 and 243d3 are closed, and the application of RF power between the rod-shaped electrodes 269c and 270c and between the rod-shaped electrodes 269d and 270d is stopped so that the supply of $NH_3$ gas or $NH_{3*}$ into the process chamber 201 is stopped. Then, the gas and the like remaining in the process chamber 201 are removed from the process chamber 201 according to the processing procedure and processing conditions which are the same as those of the purge 1 in step A (purge 2).

As the reaction gas, in addition to the $NH_3$ gas, it may be possible to use a hydrogen-nitride-based gas such as a diazene ($N_2H_2$) gas, a hydrazine ($N_2H_4$) gas, an $N_3H_8$ gas or the like.

The pre-purge 1, pre-vacuum and pre-purge 2 for the flush flow of the DCS gas and the N₂ gas in the next cycle are performed in the purge 1 as described above, but the gas charging into the tank for the flush flow of the DCS gas and the N₂ gas in the next cycle is performed in parallel with the NH₃ gas pre-flow and the NH₃* flow. FIG. 4 shows an example where the gas charging into the tank is performed in parallel with the NH₃* flow. Further, the N₂ gas charging into the process chamber for the flush flow of the DCS gas and the N₂ gas in the next cycle may be performed after the purge 2 or in the purge 2. As a result, the pre-purge 1, the pre-vacuum, the pre-purge 2, the gas charging into the tank, and the N₂ gas charging into the process chamber need not be separately performed in the next cycle, so that a cycle time can be shortened and a throughput can be improved.

[Performing Predetermined Number of Times]

A cycle that non-simultaneously, that is, alternately without synchronization, performs the above-described steps A and B is performed a predetermined number of times (n times, n being an integer of 1 or more) to thereby form a SiN film on the surface of the wafer 200. This cycle may be repeated multiple times. That is, the thickness of the SiN layer formed per cycle may be set to be smaller than a desired film thickness. Thus, the above-mentioned cycle may be repeated multiple times until the film thickness of a SiN film formed by laminating the SiN layers becomes equal to the desired film thickness.

(After-Purge and Returning to Atmospheric Pressure)

After the film-forming step is completed, the N₂ gas as the purge gas is supplied into the process chamber 201 from each of the gas supply pipes 232a1, 232b1, 232c1 and 232d1 and is exhausted through the exhaust port 231a. Thus, the interior of the process chamber 201 is purged and the residual gas and the reaction byproducts remaining in the process chamber 201 are removed from the interior of the process chamber 201 (after-purge). Thereafter, the internal atmosphere of the process chamber 201 is substituted with the inert gas (inert gas substitution) and the internal pressure of the process chamber 201 is returned to the atmospheric pressure (returning to atmospheric pressure).

(Boat Unloading and Wafer Discharging)

Thereafter, the seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading). Thereafter, the processed wafers 200 are discharged from the boat 217 (wafer discharging).

(3) Effects of the Present Embodiment

According to the present embodiment, one or more effects set forth below may be achieved.

(a) In the present embodiment, in step A, by supplying at least one selected from the group of the DCS gas and the N₂ gas stored in the tank 242a1 to the wafer 200 from the nozzle 233a and supplying at least one selected from the group of the DCS gas and the N₂ gas stored in the tank 242b1 to the wafer 200 from the nozzle 233b, the concentration of DCS gas in the tank 242a1 in the state where at least one selected from the group of the DCS gas and the N₂ gas is stored in the tank 242a1 is different from the concentration of DCS gas in the tank 242b1 in the state where at least one selected from the group of the DCS gas and the N₂ gas is stored in the tank 242b1. Thus, the concentration of DCS gas in the gas supplied by the flash flow through the nozzle 233a can be different from the concentration of DCS gas in the gas supplied by the flash flow through the nozzle 233b. That is, gases having different DCS gas concentrations can collide with each other and be brought into contact (mixed) in the plane of the wafer 200 by flash flow supply, so that multiple adsorption of DCS molecules constituting the DCS gas on the outermost surface of the wafer 200 can be suppressed and non-multiple adsorption can be promoted.

As a result, it is possible to improve the uniformity of the wafer in-plane thickness of the first layer formed on the wafer 200. As a result, it is possible to improve the uniformity of the wafer in-plane film thickness of the SiN film formed on the wafer 200. Further, since the uniformity of the wafer in-plane thickness of the first layer can be improved, the nitriding of the first layer in step B can be uniformly performed over the entire surface of the wafer, thereby improving the uniformity of the wafer in-plane film quality. Furthermore, since the multiple adsorption of DCS molecules can be suppressed, that is, the non-multiple adsorption can be promoted, not only the uniformity of the wafer in-plane thickness of the first layer can be improved, but also the thickness of the first layer can be reduced, and the nitriding of the first layer in step B can be uniformly and sufficiently performed over the entire surface of the wafer. This makes it possible to improve the film quality itself of the SiN film formed on the wafer 200. The film quality used here refers to, for example, wet etching resistance (HF resistance) of a film. In this case, improving the film quality means lowering the wet etching rate (hereinafter, referred to as WER) of the film to increase the wet etching resistance of the film.

In addition, when the concentration of DCS gas in the tank 242a1 in the state where at least one selected from the group of the DCS gas and the N₂ gas is stored in the tank 242a1 is set to be higher than the concentration of DCS gas in the tank 242b1 in the state where at least one of the DCS gas and the N₂ gas is stored in the tank 242b1 and when the concentration of N₂ gas in the tank 242b1 in the state where at least one selected from the group of the DCS gas and the N₂ gas is stored in the tank 242b1 is set to be higher than the concentration of N₂ gas in the tank 242a1 in the state where at least one selected from the group of the DCS gas and the N₂ gas is stored in the tank 242a1, it is possible to increase the above-described effect of suppressing the multiple adsorption of DCS molecules (the effect of promoting the non-multiple adsorption).

In addition, when the concentration of DCS gas in the tank 242a1 in the state where at least one selected from the group of the DCS gas and the N₂ gas is stored in the tank 242a1 is set to be higher than the concentration of N₂ gas in the tank 242a1 and when the concentration of N₂ gas in the tank 242b1 in the state where at least one selected from the group of the DCS gas and the N₂ gas is stored in the tank 242b1 is set to be higher than the concentration of DCS gas in the tank 242b1, it is possible to increase the above-described effect of suppressing the multiple adsorption of DCS molecules.

In addition, when the amount of DCS gas in the tank 242a1 in the state where at least one selected from the group of the DCS gas and the N₂ gas is stored in the tank 242a1 is set to be larger than the amount of DCS gas in the tank 242b1 in the state where at least one selected from the group of the DCS gas and the N₂ gas is stored in the tank 242b1 and when the amount of N₂ gas in the tank 242b1 in the state where at least one selected from the group of the DCS gas and the N₂ gas is stored in the tank 242b1 is set to be larger than the amount of N₂ gas in the tank 242a1 in the state where at least one selected from the group of the DCS gas and the N₂ gas is stored in the tank 242a1, it is possible to increase the above-described effect of suppressing the multiple adsorption of DCS molecules.

In addition, when the amount of DCS gas in the tank 242a1 in the state where at least one selected from the group of the DCS gas and the $N_2$ gas is stored in the tank 242a1 is set to be larger than the amount of $N_2$ gas in the tank 242a1 and when the amount of $N_2$ gas in the tank 242b1 in the state where at least one selected from the group of the DCS gas and the $N_2$ gas is stored in the tank 242b1 is set to be larger than the amount of DCS gas in the tank 242b1, it is possible to increase the above-described effect of suppressing the multiple adsorption of DCS molecules.

In particular, when the concentration of DCS gas in the tank 242a1 in the state where at least one selected from the group of the DCS gas and the $N_2$ gas is stored in the tank 242a1 is set to 100% (the concentration of $N_2$ gas is set to 0%) and when the concentration of $N_2$ gas in the tank 242b1 in the state where at least one selected from the group of the DCS gas and the $N_2$ gas is stored in the tank 242b1 is set to 100% (the concentration of DCS gas is set to 0%), in step A, since the DCS gas of the concentration of 100% supplied by the flash flow and the $N_2$ gas of the concentration of 100% supplied by the flash flow can collide with each other and be brought into contact (mixing) in the plane of the wafer 200, it is possible to further increase the above-described effect of suppressing the multiple adsorption of DCS molecules.

That is, when the DCS gas is present alone in the tank 242a1 in the state where at least one selected from the group of the DCS gas and the $N_2$ gas is stored in the tank 242a1 and when the $N_2$ gas is present alone in the tank 242b1 in the state where at least one selected from the group of the DCS gas and the $N_2$ gas is stored in the tank 242b1, it is possible to further increase the above-described effect of suppressing the multiple adsorption of DCS molecules.

(b) In performing at least step A, when a predetermined position of the edge portion of the wafers 200 passes through a triangular region connecting the nozzles 233a and 233b and the center of the wafers 200 in the plane view, by rotating the wafers 200 such that the predetermined position passes through the straight line (first straight line) connecting the nozzle 233a and the center of the wafer 200 and then passes through the straight line (second straight line) connecting the nozzle 233b and the center of the wafer 200 (in the direction of the arrow 200r shown in FIG. 2), a predetermined area in the plane of the wafer exposed to the DCS gas by supplying the DCS gas by the flash flow from the nozzle 233a can be promptly exposed to the $N_2$ gas supplied by the flash flow from the nozzle 233b, thereby further increasing the above-described effect of suppressing the multiple adsorption of DCS molecules.

In addition, this effect is not limited to the case where the DCS gas is supplied alone by the flash flow from the nozzle 233a and the $N_2$ gas is supplied alone by the flash flow from the nozzle 233b as shown in FIG. 4, but may be obtained even a case where the DCS gas is supplied alone by the flash flow from the nozzle 233a and a mixed gas of the $N_2$ gas and the DCS gas is supplied by the flash flow from the nozzle 233b as shown in FIG. 5. In addition, this effect may be obtained even a case where a mixed gas of the $N_2$ gas and the DCS gas is supplied by the flash flow from each of the nozzles 233a and 233b. However, in any case, the concentration (amount) of DCS gas in the gas supplied by the flash flow from the nozzle 233a needs to be set to be higher (larger) than the concentration (amount) of DCS gas in the gas supplied by the flash flow from the nozzle 233b, and the concentration (amount) of $N_2$ gas in the gas supplied by the flash flow from the nozzle 233b needs to be set to be higher (larger) than the concentration (amount) of $N_2$ gas in the gas supplied by the flash flow from the nozzle 233a.

(c) Before at least one selected from the group of the DCS gas and the $N_2$ gas is supplied by the flash flow from each of the nozzles 233a and 233b in step A, by filling the interior of the process chamber 201 with the $N_2$ gas to increase the internal pressure of the process chamber 201, it is possible to suppress the diffusion of the DCS gas to the entire area in the process chamber 201 when the DCS gas is supplied to the wafer 200 in the process chamber 201 and obtain the directionality (directivity) of the DCS gas flow. This makes it possible to further enhance the above-described effect of suppressing multiple adsorption of DCS molecules by causing gases having different DCS gas concentrations to collide with each other and be brought into contact (mixed) in the plane of the wafer 200 by flash flow supply.

(d) Before at least one selected from the group of the DCS gas and the $N_2$ gas is supplied by the flash flow from each of the nozzles 233a and 233b in step A, when the interior of the process chamber 201 is filled with the $N_2$ gas, by fully closing the APC valve 244 to stop the exhaust of the interior of the process chamber 201, it is possible to efficiently increase the internal pressure of the process chamber 201, thereby efficiently and sufficiently obtaining the above-described effect.

(e) When supplying at least one selected from the group of the DCS gas and the $N_2$ gas by the flash flow from each of the nozzles 233a and 233b in step A, by maintaining the state in which the internal pressure of the process chamber 201 is increased, it is possible to suppress the diffusion of the DCS gas to the entire area in the process chamber 201 when the DCS gas is supplied to the wafer 200 in the process chamber 201 and obtain the directionality (directivity) of the DCS gas flow. This makes it possible to further enhance the above-described effect of suppressing multiple adsorption of DCS molecules by causing gases having different DCS gas concentrations to collide with each other and be brought into contact (mixing) in the plane of the wafer 200 by flash flow supply.

(f) When supplying at least one selected from the group of the DCS gas and the $N_2$ gas by the flash flow from each of the nozzles 233a and 233b in step A, by fully closing the APC valve 244 to stop the exhaust of the interior of the process chamber 201, it is easy to maintain the state where the internal pressure of the process chamber 201 is increased, thereby efficiently and sufficiently obtaining the above-described effect.

(g) When at least one selected from the group of the DCS gas and the $N_2$ gas is supplied by the flash flow from each of the nozzles 233a and 233b in step A, by setting the concentration of DCS gas in the tank 242a1 in the state where at least one selected from the group of the DCS gas and the $N_2$ gas is stored in the tank 242a1 to be different from the concentration of DCS gas in the tank 242b1 in the state where at least one selected from the group of the DCS gas and the $N_2$ gas is stored in the tank 242b1, it is possible to reduce the use amount of DCS gas as compared to a case where the DCS gas of the same concentration is stored in the tanks 242a1 and 242b1, thereby reducing a precursor gas cost.

(h) Since the use amount of DCS gas can be reduced, the flow rate of the diluted $N_2$ gas flown into the exhaust pipe 231 at the downstream side of the vacuum pump 246 can be reduced in order to comply with the standard of the explosion limit of DCS gas, thereby significantly reducing the use amount of the $N_2$ gas and hence significantly reducing an $N_2$ gas cost. The explosion limit of DCS gas refers to the concentration of 4.1 to 99% of the explosion range in the atmosphere indicated in a safety data sheet of the chemical substance DCS. According to the safety data sheet, the concentration of DCS gas in the exhaust pipe at the downstream side of the vacuum pump must not exceed 4.1%, but this is a rule that focuses on safety. This means that when an unintended disaster such as an earthquake causes an external leak (mixture with the atmosphere) in the exhaust pipe at the downstream side of the vacuum pump, an explosion will not occur if the concentration of DCS gas in the exhaust pipe does not exceed 4.1%. This is a minimum standard for ensuring device safety just in case.

(i) Since the use amount of DCS gas can be reduced, a period during which the amount of generated particles can be kept low can be extended, thereby lengthening a maintenance cycle and significantly reducing a device operation costs.

(j) The above-described effects resulting from the reduction in the use amount of DCS gas are remarkable when a difference between the concentration of DCS gas in the tank $242a1$ and the concentration of DCS gas in the tank $242b1$ is large, particularly more remarkable when the concentration of DCS gas in the tank $242a1$ in the state where at least one selected from the group of the DCS gas and the $N_2$ gas is stored in the tank $242a1$ is set to 100% (the concentration of the $N_2$ gas is 0%) and when the concentration of $N_2$ gas in the tank $242b1$ in the state where at least one selected from the group of the DCS gas and the $N_2$ gas is stored in the tank $242b1$ is set to 100% (the concentration of the DCS gas is 0%).

(k) The SiN film formed in the above-described embodiments has high film thickness uniformity, high film quality uniformity, low chlorine concentration in the film, and high film quality, that is, high etching resistance. Therefore, the SiN film formed in the above-described embodiments can be suitably used as a sidewall spacer, an etching stopper, a hard mask and the like in various semiconductor devices such as a logic device, a memory device and the like.

<Other Embodiments of the Present Disclosure>

While some embodiments of the present disclosure have been described in detail above, the present disclosure is not limited to the above-described embodiments but may be variously modified without departing from the subject matter of the present disclosure.

Figure 6:
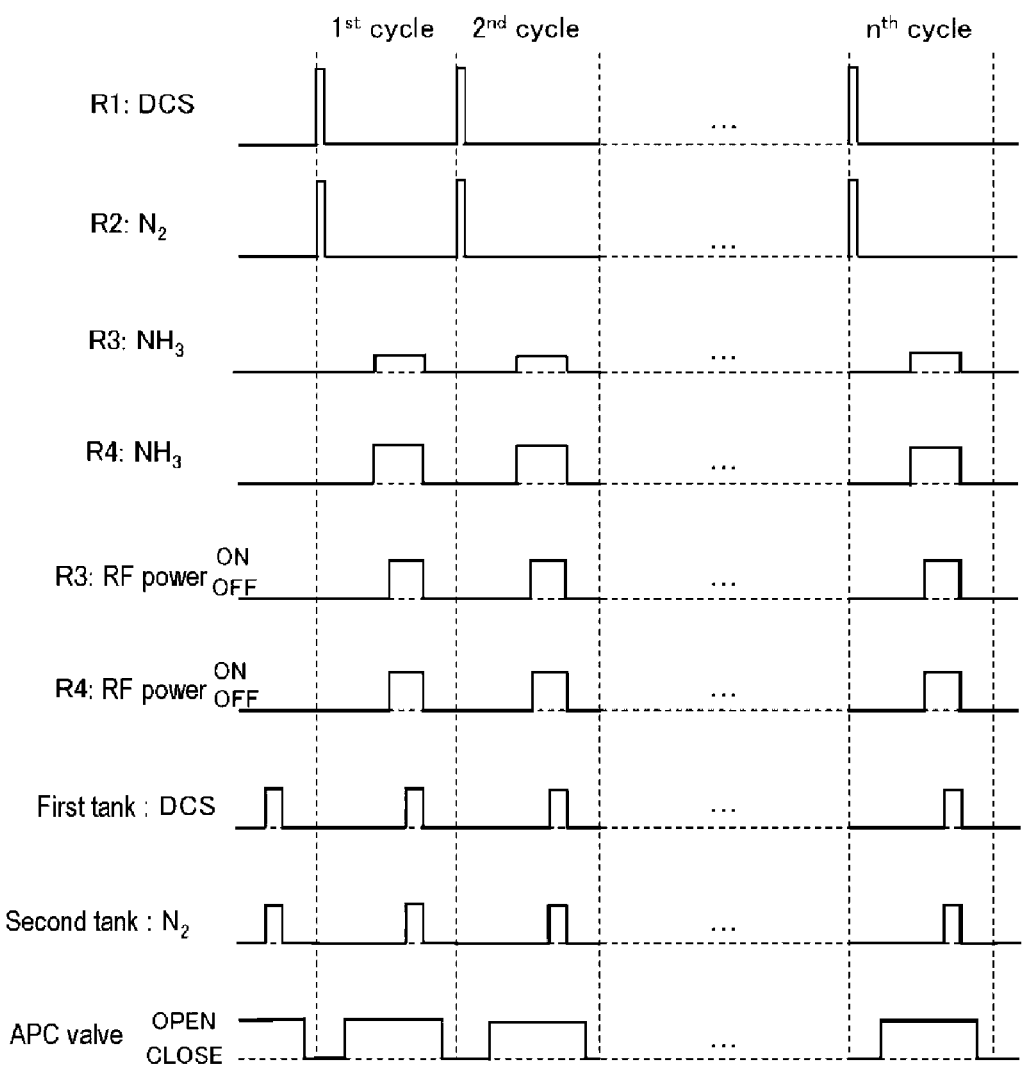
FIG. 6 is a diagram showing an example of supply timings of main gases and supply timings of RF power in a film-forming sequence according to another embodiment of the present disclosure.

The example in which the $NH_3$ gases supplied to the plurality of plasma excitation parts at the same flow rate are respectively plasma-excited and supplied to the wafer 200 in step B has been described in the above-described embodiments. However, the present disclosure is not limited to such embodiments. For example, as shown in FIG. 6, in step B, the $NH_3$ gases supplied at different flow rates to the plurality of plasma excitation parts may be respectively plasma-excited and supplied to the wafer 200. That is, in step B, active species such as $NH_3$* generated by respectively plasma-exciting the $NH_3$ gases supplied to the plurality of plasma excitation parts at different flow rates may be supplied to the wafer 200 from the plurality of plasma excitation parts. In this case, the $NH_3$ gas supply flow rate (R3) may be, for example, 1,000 to 3,000 sccm, and the $NH_3$ gas supply flow rate (R4) may be, for example, 2,000 to 5,000 sccm. Other processing conditions may be the same as the processing conditions in the above-described embodiments.

In this case, since the amount of $NH_3$ gas or $NH_3$* supplied from the buffer chambers $237c$ and $237d$ can be set to be different from each other, a nitridation amount of the first layer in the plane of the wafer 200 can be adjusted. This makes it possible to improve the uniformity of wafer in-plane film quality of the SiN film formed on the wafer 200, and it is also possible to improve the film quality itself of the SiN film formed on the wafer 200, depending on a method of adjusting the nitridation amount in the plane of the wafer 200.

In addition, the example in which the two buffer chambers $237c$ and $237d$ are arranged so as to face each other with the center of the wafer 200 interposed therebetween has been described in the above-described embodiments. However, the present disclosure is not limited to such embodiments. For example, the two buffer chambers $237c$ and $237d$ may be arranged in the line-symmetrical relationship, with having a straight line connecting the center of the wafer 200, that is, the center of the reaction tube 203, and the center of the exhaust port $231a$ as a symmetrical axis in the plane view, may be respectively arranged so as to be closer to the exhaust port $231a$ side, or may be arranged so as to be closer to the side distant from the exhaust port $231a$. In other words, a central angle formed by a straight line connecting the center of the buffer chamber $237c$ and the center of the wafer 200 and a straight line connecting the center of the buffer chamber $237d$ and the center of the wafer 200 (a central angle with respect to an arc with centers of the buffer chambers $237c$ and $237d$ as both ends) is not limited to 180°, and may be less than 180° or excess 180°. In any of these cases, the gas supply holes $250c$ and $250d$ of the buffer chambers $237c$ and $237d$ are formed in the line-symmetrical relationship with having the straight line connecting the center of the wafer 200 and the center of the exhaust port $231a$ as the symmetrical axis. Even in these cases, the same effects as those in the above-described embodiments can be obtained.

In addition, the example in which the two plasma excitation parts are installed has been described in the above-described embodiments. However, three or more plasma excitation parts may be installed. Even in such a case, the plurality of plasma excitation parts may be installed in the line-symmetrical relationship with having the straight line connecting the center of the wafer 200 and the center of the exhaust port $231a$ as the symmetrical axis in the plane view. Even in these cases, the same effects as those in the above-described embodiments can be obtained.

In addition, the examples in which the SiN film is formed as the thin film by using the DCS gas as the precursor gas and the $NH_3$ gas as the reaction gas have been described in the above-described embodiments. However, the present disclosure is not limited to such an embodiment.

For example, as the precursor gas, in addition to the above-described halosilane-based gas such as the DCS gas and aminosilane-based gas, it may be possible to use a metal halide gas such as a titanium tetrachloride ($TiCl_4$) gas or the like. Further, for example, as the reaction gas, in addition to the N-containing gas such as the $NH_3$ gas, it may be possible to use an oxygen (O)-containing gas such as an oxygen ($O_2$) gas, an N and carbon (C)-containing gas such as a triethylamine (($C_2H_5)_3N$, abbreviation: TEA) gas, a C-containing gas such as a propylene ($C_3H_6$) gas, a boron (B)-containing gas such as a trichloroborane ($BCl_3$) gas, and the like. Then, according to the following gas supply sequence, a silicon oxynitride film (SiON film), a silicon carbonitride film (SiCN film), a silicon oxycarbonitride film (SiOCN film), a silicon oxycarbide film (SiOC film), a silicon oxide film (SiO film), a silicon boronitride film (SiBN film), a silicon borocarbonitride film (SiBCN film), a titanium nitride film (TiN film), a titanium oxynitride film (TiON film) or the like may be formed on the surface of the wafer 200. Even in these cases, the same effects as those in the above-described embodiments can be obtained.

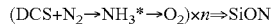

(DCS+N$_2$→NH$_3$*→O$_2$)×n⇒SiON

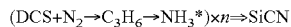

(DCS+N$_2$→C$_3$H$_6$→NH$_3$*)×n⇒SiCN

(DCS+N$_2$→C$_3$H$_6$→NH$_3$*→O$_2$)×n⇒SiOCN

(DCS+N$_2$→TEA→NH$_3$*→O$_2$)×n⇒SiOC(N)

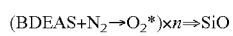

(BDEAS+N$_2$→O$_2$*)×n⇒SiO

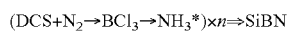

(DCS+N$_2$→BCl$_3$→NH$_3$*)×n⇒SiBN

(DCS+N$_2$→C$_3$H$_6$→BCl$_3$→NH$_3$*)×n⇒SiBCN

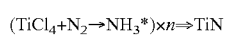

(TiCl$_4$+N$_2$→NH$_3$*)×n⇒TiN

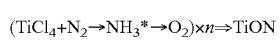

(TiCl$_4$+N$_2$→NH$_3$*→O$_2$)×n⇒TiON

In this manner, the present disclosure may be applied not only to formation of a silicon-containing film such as the SiN film and the SiON film, but also to formation of a metal-containing film such as the TiN film, and even in such cases, the same effects as those in the above-described embodiments may be achieved. That is, the present disclosure may be applied to a case where a film containing a predetermined element such as a metalloid element (semiconductor element) or a metal element is formed.

Recipes used in each process may be provided individually according to the processing contents and may be stored in the memory device 121c via a telecommunication line or the external memory device 123 in some embodiments. Moreover, when each process begins, the CPU 121a may properly select an appropriate recipe from the recipes stored in the memory device 121c according to the processing contents in some embodiments. Thus, it is possible for a single substrate processing apparatus to form films of various kinds, composition ratios, qualities, and thicknesses with enhanced reproducibility. Further, it is possible to reduce an operator's burden and to quickly start each substrate processing while avoiding an operation error.

The recipes mentioned above are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

The examples in which films are formed using a batch-type substrate processing apparatus capable of processing a plurality of substrates at a time have been described in the above-described embodiments. The present disclosure is not limited to the above-described embodiments but may be suitably applied, for example, to a case where films are formed using a single-wafer-type substrate processing apparatus capable of processing a single substrate or several substrates at a time. In addition, the examples in which films are formed using a substrate processing apparatus including a hot-wall-type process furnace have been described in the above-described embodiments. The present disclosure is not limited to the above-described embodiments but may be suitably applied to a case where films are formed using a substrate processing apparatus including a cold-wall-type process furnace.

Even in the case of using these substrate processing apparatuses, each process may be performed according to the same processing procedures and processing conditions as those in the above-described embodiments, and the same effects as those of the above-described embodiments can be achieved.

The above-described embodiments may be used in proper combination. The processing procedures and processing conditions used in such cases may be the same as those of the above-described embodiments.

EXAMPLES

Example 1

The substrate processing apparatus shown in FIG. 1 is used to form SiN films on a plurality of wafers according to a film-forming sequence in the same as or similar to the film-forming sequence in the above-described embodiments. In the gas charging into the tank, the amount of each gas stored in each tank is set under the following three conditions (conditions 1 to 3), and evaluation samples of three types of SiN films were provided. Processing conditions other than the gas charging into the tank are the same as the processing conditions in the above-described embodiments, and are the same in the conditions 1 to 3.
<Condition 1>
  Amount of DCS gas stored in a first tank: 200 to 300 cc
  Amount of N$_2$ gas stored in the first tank: 0 cc
  Amount of DCS gas stored in a second tank: 0 cc
  Amount of N$_2$ gas stored in the second tank: 200 to 300 cc
  Concentration of DCS gas stored in the first tank (100%)> concentration of DCS gas stored in the second tank (0%)
<Condition 2>
  Amount of DCS gas stored in the first tank: 200 to 300 cc
  Amount of N$_2$ gas stored in the first tank: 0 cc
  Amount of DCS gas stored in the second tank: 200 to 300 cc Amount of N$_2$ gas stored in the second tank: 0 cc
  Concentration of DCS gas stored in the first tank (100%)= concentration of DCS gas stored in the second tank (100%)
<Condition 3>
  Amount of DCS gas stored in the first tank: 100 to 150 cc
  Amount of N$_2$ gas stored in the first tank: 100 to 150 cc
  Amount of DCS gas stored in the second tank: 100 to 150 cc
  Amount of N$_2$ gas stored in the second tank: 100 to 150 cc Concentration of DCS gas stored in the first tank (40 to 60%)=concentration of DCS gas stored in the second tank (40 to 60%)

Figures 7, 8:
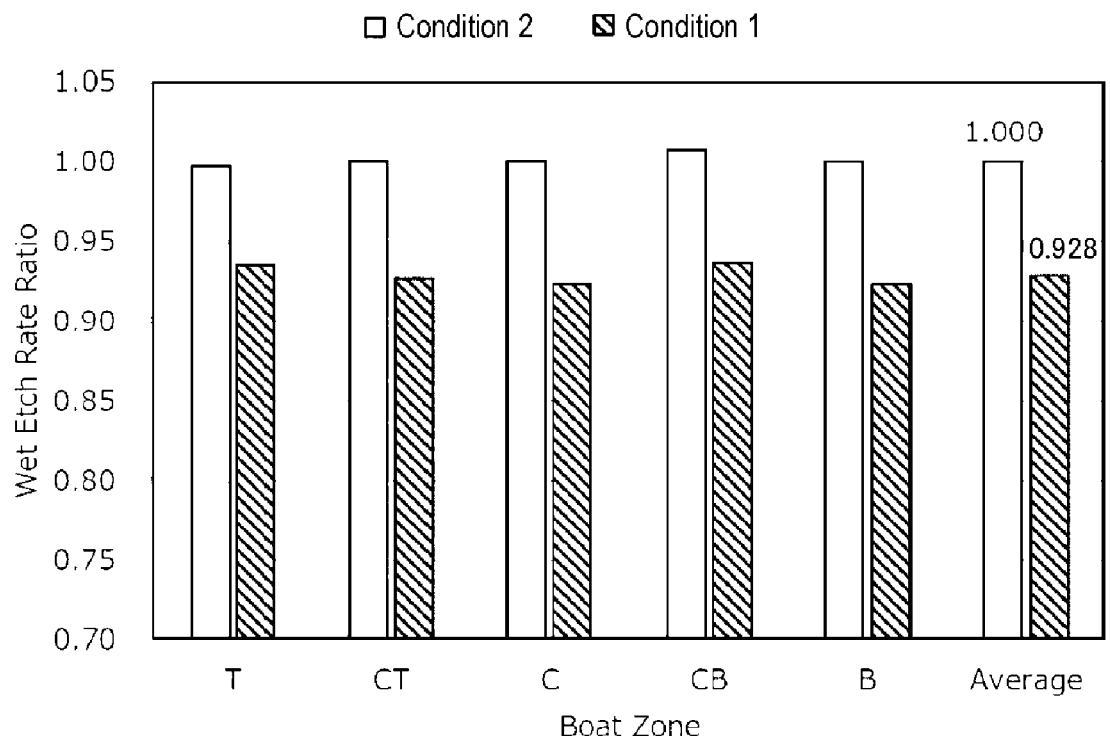
FIG. 7 is a table showing measurement results of uniformity of wafer in-plane film thickness and uniformity of inter-wafer film thickness when a SiN film is formed on a wafer while changing conditions of gas charging into a tank.
FIG. 8 is a bar graph showing measurement results of a wet etching rate of a SiN film when the SiN film is formed on a wafer while changing conditions of gas charging into a tank.

After the evaluation samples of three types of SiN films are provided, the uniformity of wafer in-plane film thickness and the uniformity of inter-wafer film thickness of each SiN film are measured. The results are shown in FIG. 7. It can be seen that as the respective values of the uniformity of wafer in-plane film thickness and the uniformity of inter-wafer film thickness decrease, the uniformities becomes better (the uniformities increase).

It can be confirmed from FIG. 7 that the wafer in-plane film thickness uniformity and the inter-wafer film thickness uniformity of the SiN film formed under the condition 1 are respectively better than the wafer in-plane film thickness uniformity and the inter-wafer film thickness uniformity of the SiN film formed under the conditions 2 and 3.

Example 2

The substrate processing apparatus shown in FIG. 1 is used to form SiN films on a plurality of wafers according to a film-forming sequence in the same as or similar to the film-forming sequence in the above-described embodiments. In the gas charging into the tank, the amount of each gas stored in each tank is set under the two conditions 1 and 2 in Example 1, and evaluation samples of two types of SiN films are provided. The processing conditions other than the gas charging into the tank are the same as the processing conditions in the above-described embodiments, and are the same in the conditions 1 and 2.

After providing the evaluation samples of two types of SiN films, each SiN film is subjected to wet etching using a 1% HF aqueous solution, and the wet etching rate (WER) of each SiN film is measured. The results are shown in FIG. 8.

A horizontal axis in FIG. 8 represents a boat zone, that is, a position of each wafer in to vertical direction of a boat when SiN films are formed on a plurality of wafers, in which T, CT, C, CB and B indicate a top, a center top, a center, a center bottom, and a bottom of the boat, respectively. The "Average" at the right end of the horizontal axis in FIG. 8 indicates averages of the values on a vertical axis in T, CT, C, CB and B. The vertical axis in FIG. 8 represents a ratio of WER (hereinafter referred as a WER ratio) when the average of WERs of the SiN films formed on the wafers disposed on each of T, CT, C, CB and B under the condition 2 is 1 (reference). It can be seen that as a value of the WER ratio decreases, a wet etching resistance increases.

It can be confirmed from FIG. 8 that the value of the WER ratio of the SiN film formed under the condition 1 is smaller than the value of the WER ratio of the SiN film formed under the condition 2, and the wet etching resistance of the SiN film formed under the condition 1 is higher than that of the SiN film formed under the condition 2. It can be also confirmed that the SiN film formed under the condition 1 have a good inter-wafer uniformity of the WER ratio.

Example 3

The substrate processing apparatus shown in FIG. 1 is used to form SiN films on a plurality of wafers according to a film-forming sequence in the same as or similar to the film-forming sequence in the above-described embodiments. In the gas charging into the tank, the amount of each gas stored in each tank is set under the two conditions 1 and 2 in Example 1, and samples of two types of SiN films are provided. The processing conditions other than the gas charging into the tank are the same as the processing conditions in the above-described embodiments, and are the same in the conditions 1 and 2.

At this time, an effective flow rate of DCS gas and the flow rate of diluted $N_2$ gas flown into the exhaust pipe at the downstream side of the vacuum pump in order to comply with the standard of the explosion limit of the DCS gas are measured. The results are shown in FIG. 9.

It can be confirmed from FIG. 9 that the effective flow rate of DCS gas can be reduced and the flow rate of diluted $N_2$ gas flown into the exhaust pipe on the downstream side of the vacuum pump can be reduced in a case where the SiN film is formed under the condition 1 as compared with a case where the SiN film is formed under the condition 2. Further, it is confirmed that by forming the SiN film under the condition 1, the use amount of DCS gas and the use amount of $N_2$ gas can be reduced by 40%, respectively, as compared with a case where the SiN film is formed under the condition 2, and the use amounts of the gases can be significantly reduced, thereby significantly reducing a gas cost.

Example 4

The substrate processing apparatus shown in FIG. 1 is used to form SiN films on a plurality of wafers according to a film-forming sequence in the same as or similar to the film-forming sequence shown in FIG. 6. In step B, the flow rate of $NH_3$ gas supplied into each buffer chamber is set under the following two conditions 4 and 5, and evaluation samples of two types of SiN films are provided. Other processing conditions are the same as the processing conditions in the above-described embodiments, and are the same in the conditions 4 and 5.

<Condition 4>

$NH_3$ gas flow rate supplied into a first buffer chamber: 1 to 2 slm $NH_3$ gas flow rate supplied into a second buffer chamber: 5 to 6 slm $NH_3$ gas flow rate supplied into the first buffer chamber <$NH_3$ gas flow rate supplied into the second buffer chamber <Condition 5>

$NH_3$ gas flow rate supplied into the first buffer chamber: 3 to 4 slm $NH_3$ gas flow rate supplied into the second buffer chamber: 3 to 4 slm $NH_3$ gas flow rate supplied into the first buffer chamber=$NH_3$ gas flow rate supplied into the second buffer chamber After providing the evaluation samples of two types of SiN films, each SiN film is subjected to wet etching using a 1% HF aqueous solution, and a WER of each SiN film is measured. The results are shown in FIG. 10. FIG. 10 shows a WER ratio when the WER of the SiN film formed on the wafer under the condition 5 is 1 (reference).

It can be confirmed from FIG. 10 that a value of the WER ratio of the SiN film formed under the condition 4 is smaller than a value of the WER ratio (reference value) of the SiN film formed under the condition 5, and a wet etching resistance of the SiN film formed under the condition 4 is higher than that of the SiN film formed under the condition 5.

According to the present disclosure in some embodiments, it is possible to improve uniformity of substrate in-plane film thickness of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    forming a film on the substrate in a process chamber by performing a cycle a predetermined number of times, the cycle including:
    (a) supplying a precursor gas and an inert gas to the substrate; and (b) supplying a reaction gas to the substrate,
wherein in (a), at least one selected from the group of the precursor gas and the inert gas stored in a first tank is supplied to the substrate, and at least one selected from the group of the precursor gas and the inert gas stored in a second tank different from the first tank is supplied to the substrate,
wherein an amount of the precursor gas in the first tank in a state where at least one selected from the group of the precursor gas and the inert gas is stored in the first tank is set to be different from an amount of the precursor gas in the second tank in a state where at least one selected from the group of the precursor gas and the inert gas is stored in the second tank, and
wherein in (a), the at least one selected from the group of the precursor gas and the inert gas is supplied from the first tank to the substrate, and the at least one selected from the group of the precursor gas and the inert gas is supplied from the second tank to the substrate so as to suppress multiple adsorption of molecules constituting the precursor gas on a surface of the substrate.

2. The method of claim 1, wherein the amount of the precursor gas in the first tank in the state where at least one selected from the group of the precursor gas and the inert gas is stored in the first tank is set to be larger than the amount of the precursor gas in the second tank in the state where at least one selected from the group of the precursor gas and the inert gas is stored in the second tank.

3. The method of claim 1, wherein an amount of the inert gas in the second tank in the state where at least one selected from the group of the precursor gas and the inert gas is stored in the second tank is set to be larger than an amount of the inert gas in the first tank in the state where at least one selected from the group of the precursor gas and the inert gas is stored in the first tank.

4. The method of claim 1, wherein the amount of the precursor gas in the first tank is set to be larger than an amount of the inert gas in the first tank in the state where at least one selected from the group of the precursor gas and the inert gas is stored in the first tank, and
wherein an amount of the inert gas in the second tank is set to be larger than the amount of the precursor gas in the second tank in the state where at least one selected from the group of the precursor gas and the inert gas is stored in the second tank.

5. The method of claim 1, wherein a concentration of the precursor gas in the first tank in the state where at least one selected from the group of the precursor gas and the inert gas is stored in the first tank is set to be different from a concentration of the precursor gas in the second tank in the state where at least one selected from the group of the precursor gas and the inert gas is stored in the second tank.

6. The method of claim 1, wherein a concentration of the precursor gas in the first tank in the state where at least one selected from the group of the precursor gas and the inert gas is stored in the first tank is set to be higher than a concentration of the precursor gas in the second tank in the state where at least one selected from the group of the precursor gas and the inert gas is stored in the second tank.

7. The method of claim 1, wherein a concentration of the inert gas in the second tank in the state where at least one selected from the group of the precursor gas and the inert gas is stored in the second tank is set to be higher than a concentration of the inert gas in the first tank in the state where at least one selected from the group of the precursor gas and the inert gas is stored in the first tank.

8. The method of claim 1, wherein a concentration of the precursor gas in the first tank is set to be higher than a concentration of the inert gas in the first tank in the state where at least one selected from the group of the precursor gas and the inert gas is stored in the first tank, and
wherein a concentration of the inert gas in the second tank is set to be higher than a concentration of the precursor gas in the second tank in the state where at least one selected from the group of the precursor gas and the inert gas is stored in the second tank.

9. The method of claim 1, wherein the precursor gas is present alone in the first tank in the state where at least one selected from the group of the precursor gas and the inert gas is stored in the first tank, and
wherein the inert gas is present alone in the second tank in the state where at least one selected from the group of the precursor gas and the inert gas is stored in the second tank.

10. The method of claim 1, wherein a central angle formed by a first straight line connecting a center of the substrate and a first supplier, from which a gas stored in the first tank is supplied, and a second straight line connecting the center of the substrate and a second supplier, from which a gas stored in the second tank is supplied, in a plane view is an acute angle, and
wherein in at least (a), when a predetermined position of an edge portion of the substrate passes through a triangular region connecting the first supplier, the second supplier, and the center of the substrate in the plane view, the substrate is rotated such that the predetermined position passes through the second straight line after passing through the first straight line.

11. The method of claim 1, wherein in (a), an element or elements contained in the at least one selected from the group of the precursor gas and the inert gas supplied from the first tank and an element or elements contained in the at least one selected from the group of the precursor gas and the inert gas supplied from the second tank are in contact with each other in a plane of the substrate so as to suppress multiple adsorption of molecules constituting the precursor gas on a surface of the substrate.

12. The method of claim 1, wherein in (a), an element or elements contained in the at least one selected from the group of the precursor gas and the inert gas supplied from the first tank and an element or elements contained in the at least one selected from the group of the precursor gas and the inert gas supplied from the second tank are mixed with each other in a plane of the substrate so as to promote non-multiple adsorption of molecules constituting the precursor gas on a surface of the substrate.

13. The method of claim 1, wherein in (a), an element or elements contained in the precursor gas supplied from the first tank and an element or elements contained in the inert gas supplied from the second tank are in contact with each other in a plane of the substrate so as to suppress multiple adsorption of molecules constituting the precursor gas on a surface of the substrate.

14. The method of claim 1, wherein in (a), an element or elements contained in the precursor gas supplied from the first tank and an element or elements contained in the inert gas supplied from the second tank are mixed with each other in a plane of the substrate so as to promote non-multiple adsorption of molecules constituting the precursor gas on a surface of the substrate.

15. The method of claim 1, wherein (a) is performed in a state where an exhaust of the precursor gas from the process chamber is stopped.

16. The method of claim 1, wherein (a) is performed in a state where a valve installed at an exhaust pipe configured to exhaust an interior of the process chamber is fully closed.

17. The method of claim 1, wherein in (a), the process chamber is filled with the inert gas before the precursor gas and the inert gas are supplied to the substrate.

18. The method of claim 1, wherein in (b), the reaction gas supplied to a plurality of plasma exciters at different flow rates is plasma-excited in each of the plurality of plasma exciters and supplied to the substrate.

19. A non-transitory computer-readable recording medium storing a program that causes, by a computer, a substrate processing apparatus to perform a process comprising the method of claim 1.

20. A method of manufacturing a semiconductor device, comprising:
   forming a film on a substrate in a process chamber by performing a cycle a predetermined number of times, the cycle including:
   (a) supplying a precursor gas and an inert gas to the substrate; and
   (b) supplying a reaction gas to the substrate,
   wherein in (a), at least one selected from the group of the precursor gas and the inert gas stored in a first tank is supplied to the substrate, and at least one selected from the group of the precursor gas and the inert gas stored in a second tank different from the first tank is supplied to the substrate,
   wherein an amount of the precursor gas in the first tank in a state where at least one selected from the group of the precursor gas and the inert gas is stored in the first tank is set to be different from an amount of the precursor gas in the second tank in a state where at least one selected from the group of the precursor gas and the inert gas is stored in the second tank, and
   wherein in (a), the at least one selected from the group of the precursor gas and the inert gas is supplied from the first tank to the substrate, and the at least one selected from the group of the precursor gas and the inert gas is supplied from the second tank to the substrate so as to suppress multiple adsorption of molecules constituting the precursor gas on a surface of the substrate.

21. A substrate processing apparatus comprising:
   a process chamber in which a substrate is processed;
   a first supply system configured to supply at least one selected from the group of a precursor gas and an inert gas stored in a first tank to the substrate in the process chamber;
   a second supply system configured to supply at least one selected from the group of the precursor gas and the inert gas stored in a second tank different from the first tank to the substrate in the process chamber;
   a third supply system configured to supply a reaction gas to the substrate in the process chamber; and
   a controller configured to be capable of controlling the first supply system, the second supply system and the third supply system to perform a process of forming a film on the substrate in the process chamber by performing a cycle a predetermined number of times, the cycle including: (a) supplying the precursor gas and the inert gas to the substrate; and (b) supplying the reaction gas to the substrate, wherein in (a), at least one selected from the group of the precursor gas and the inert gas stored in the first tank is supplied to the substrate, and at least one selected from the group of the precursor gas and the inert gas stored in the second tank is supplied to the substrate, wherein an amount of the precursor gas in the first tank in a state where at least one selected from the group of the precursor gas and the inert gas is stored in the first tank is set to be different from an amount of the precursor gas in the second tank in a state where at least one selected from the group of the precursor gas and the inert gas is stored in the second tank, and wherein in (a), the at least one selected from the group of the precursor gas and the inert gas is supplied from the first tank to the substrate, and the at least one selected from the group of the precursor gas and the inert gas is supplied from the second tank to the substrate so as to suppress multiple adsorption of molecules constituting the precursor gas on a surface of the substrate.

* * * * *